United States Patent
Koshimizu et al.

(10) Patent No.: US 11,764,082 B2
(45) Date of Patent: *Sep. 19, 2023

(54) CONTROL METHOD AND PLASMA PROCESSING APPARATUS

(71) Applicant: Tokyo Electron Limited, Tokyo (JP)

(72) Inventors: Chishio Koshimizu, Miyagi (JP); Shinji Kubota, Miyagi (JP); Koji Maruyama, Miyagi (JP); Takashi Dokan, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/978,193

(22) PCT Filed: Jul. 17, 2019

(86) PCT No.: PCT/JP2019/028024
§ 371 (c)(1),
(2) Date: Sep. 4, 2020

(87) PCT Pub. No.: WO2020/026802
PCT Pub. Date: Feb. 6, 2020

(65) Prior Publication Data
US 2021/0043472 A1 Feb. 11, 2021

(30) Foreign Application Priority Data

Jul. 30, 2018 (JP) ................................ 2018-142855
Jun. 10, 2019 (JP) ................................ 2019-108223

(51) Int. Cl.
*H01L 21/00* (2006.01)
*H01L 21/67* (2006.01)
*H01J 37/32* (2006.01)

(52) U.S. Cl.
CPC .. *H01L 21/67069* (2013.01); *H01J 37/32045* (2013.01); *H01J 37/32183* (2013.01); *H01J 37/32697* (2013.01); *H01J 2237/3347* (2013.01)

(58) Field of Classification Search
CPC ................................ H01J 37/32027
See application file for complete search history.

(56) References Cited

U.S. PATENT DOCUMENTS 10,672,589 B2 * 6/2020 Koshimizu ............. H01J 37/04
11,201,034 B2 * 12/2021 Hisatomi .......... H01J 37/32724
(Continued)

FOREIGN PATENT DOCUMENTS

JP 2006-270017 A 10/2006
JP 2006-270019 A 10/2006
(Continued)

OTHER PUBLICATIONS

International Search Report and Written Opinion dated Oct. 15, 2019 for PCT/JP2019/028024 filed on Jul. 17, 2019, 8 pages including English Translation of the International Search Report.

*Primary Examiner* — Parviz Hassanzadeh
*Assistant Examiner* — Michelle Crowell
(74) *Attorney, Agent, or Firm* — XSENSUS LLP

(57) ABSTRACT

A control method of a plasma processing apparatus including a first electrode and a second electrode includes supplying a bias power to the first electrode, and supplying a negative DC voltage to the second electrode. The negative DC voltage periodically repeats a first state that takes a first voltage value and a second state that takes a second voltage value having an absolute value smaller than the first voltage value. The control method further includes a first control process of applying the first state of the negative DC voltage in a partial time period within each cycle of a signal synchronized with a cycle of a radio frequency of the bias
(Continued)

power, or in a partial time period within each cycle of a periodically varying parameter measured in a transmission path of the bias power, and applying the second state continuously with the first state.

12 Claims, 15 Drawing Sheets

(56) References Cited

U.S. PATENT DOCUMENTS

| | | | | |
|---|---|---|---|---|
| 11,574,798 B2* | 2/2023 | Koshimizu | ............. | H01J 37/16 |
| 2009/0242516 A1* | 10/2009 | Honda | ............. | H01L 21/67069 |
| | | | | 438/729 |
| 2010/0213162 A1* | 8/2010 | Mochiki | ........... | H01J 37/32091 |
| | | | | 216/17 |
| 2012/0052689 A1* | 3/2012 | Tokashiki | ......... | H01L 21/31116 |
| | | | | 156/345.28 |
| 2014/0144876 A1* | 5/2014 | Nakagawa | ........ | H01L 21/31144 |
| | | | | 216/51 |
| 2015/0000842 A1* | 1/2015 | Hirano | ............. | H01J 37/32045 |
| | | | | 307/26 |
| 2016/0079037 A1* | 3/2016 | Hirano | ............. | H01J 37/32183 |
| | | | | 156/345.28 |
| 2020/0266036 A1* | 8/2020 | Aoki | ................ | H01J 37/32715 |
| 2022/0076921 A1* | 3/2022 | Hisatomi | .......... | H01J 37/32146 |

FOREIGN PATENT DOCUMENTS

| | | | | | |
|---|---|---|---|---|---|
| JP | 2010171320 A | * | 8/2010 | ........ | H01J 37/32091 |
| JP | 2017147370 A | * | 8/2017 | ........ | H01J 37/32146 |

* cited by examiner

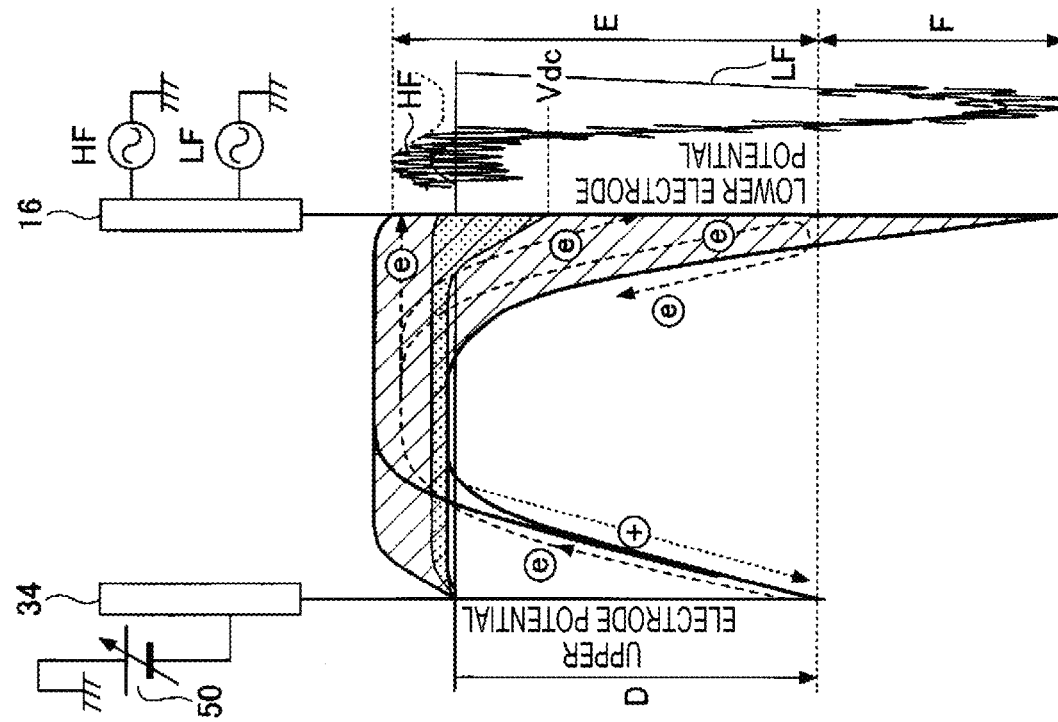
FIG. 4B HF/LF/DC
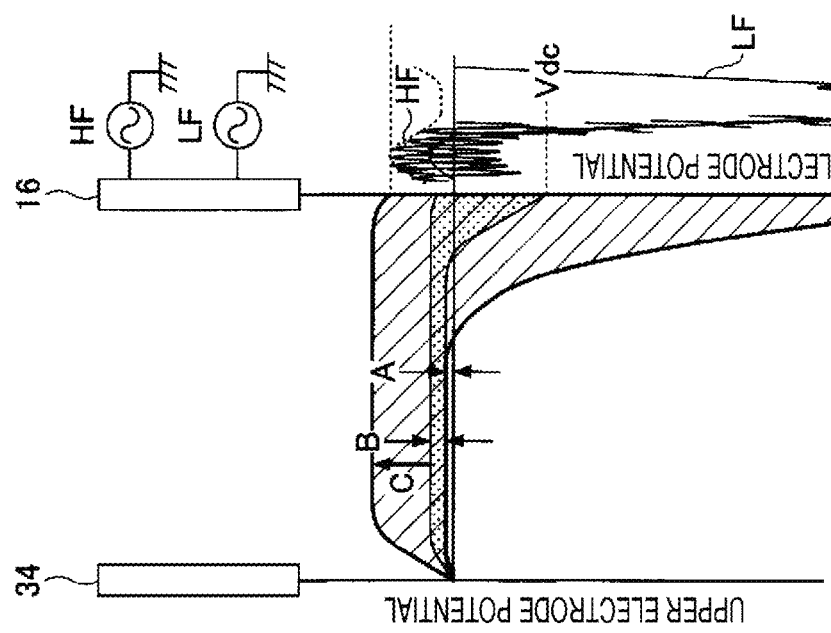
FIG. 4A HF/LF

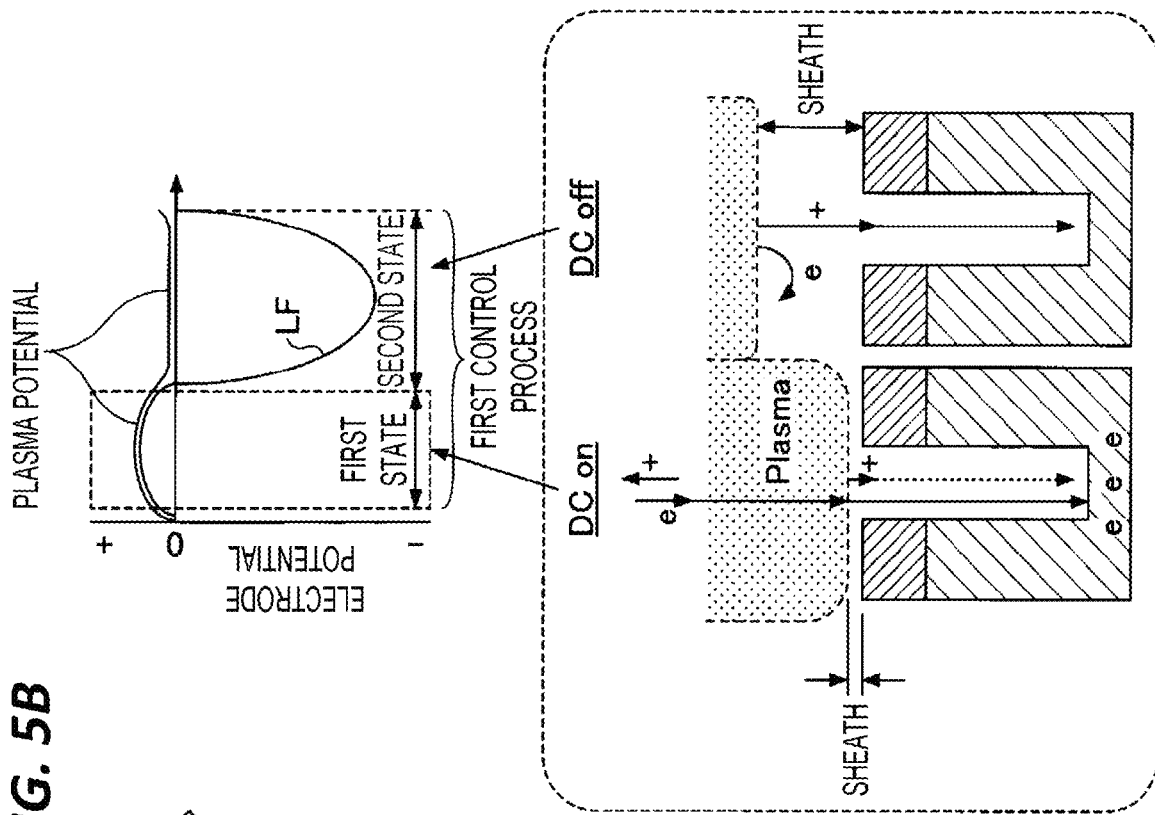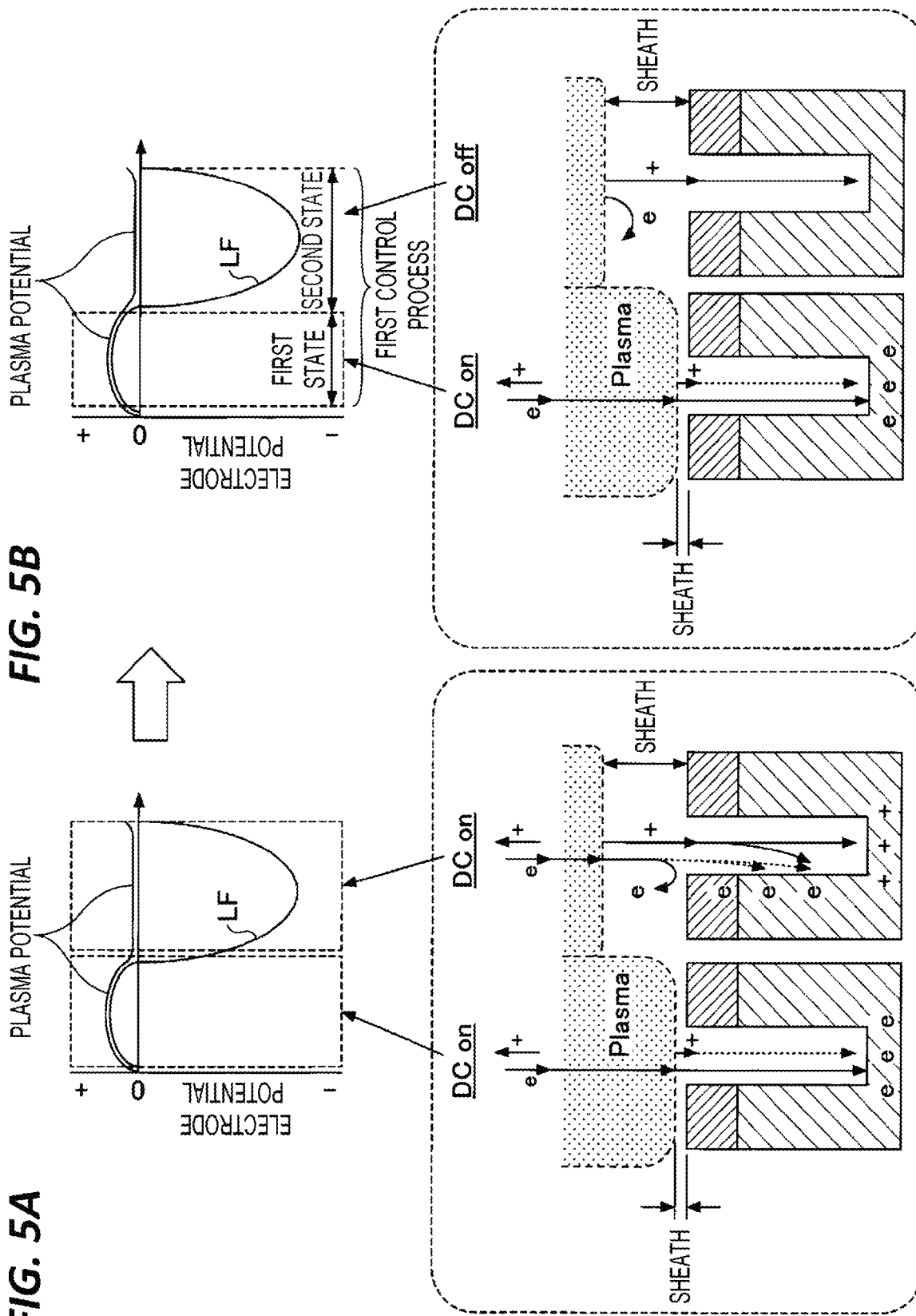
FIG. 5A
FIG. 5B

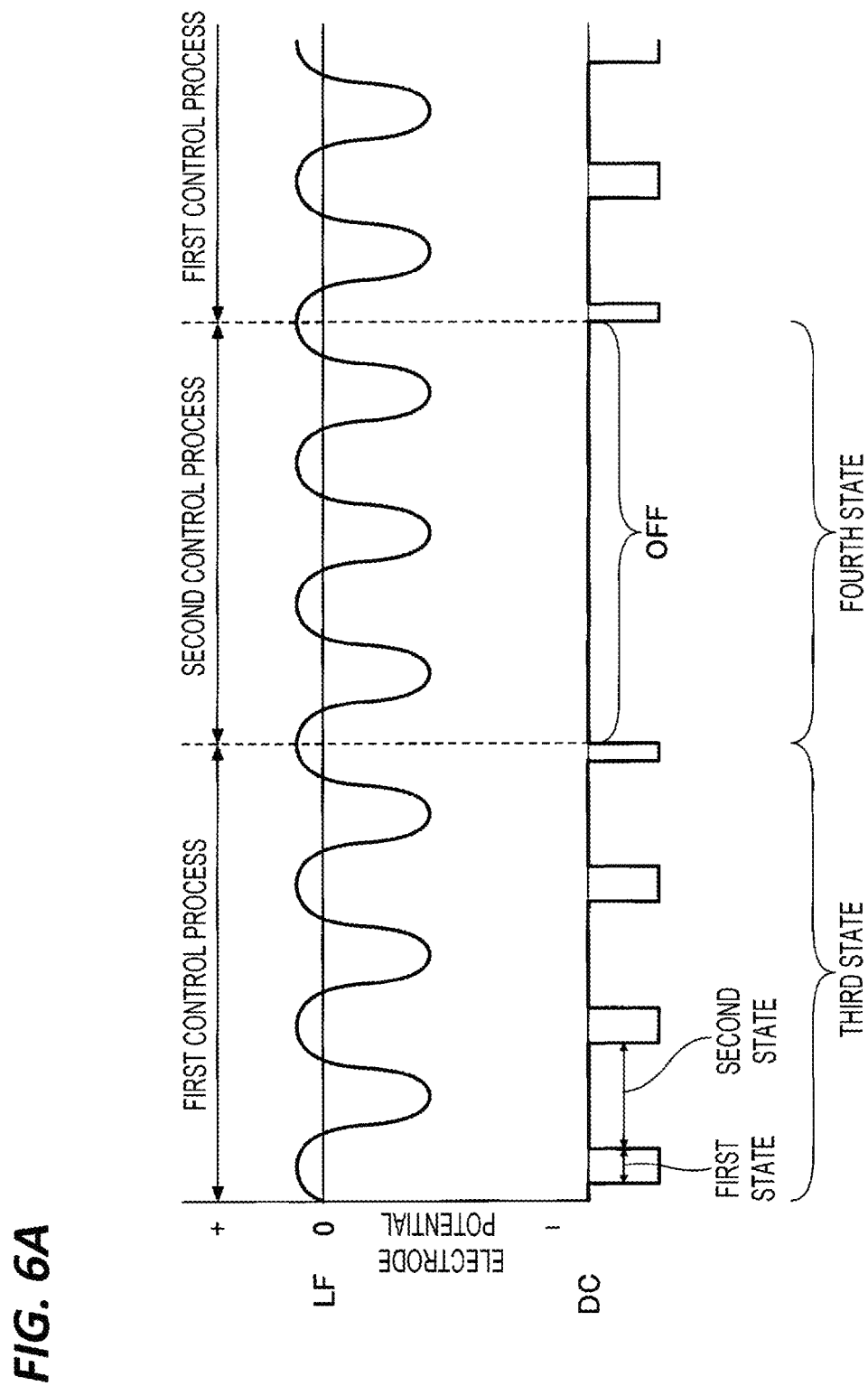

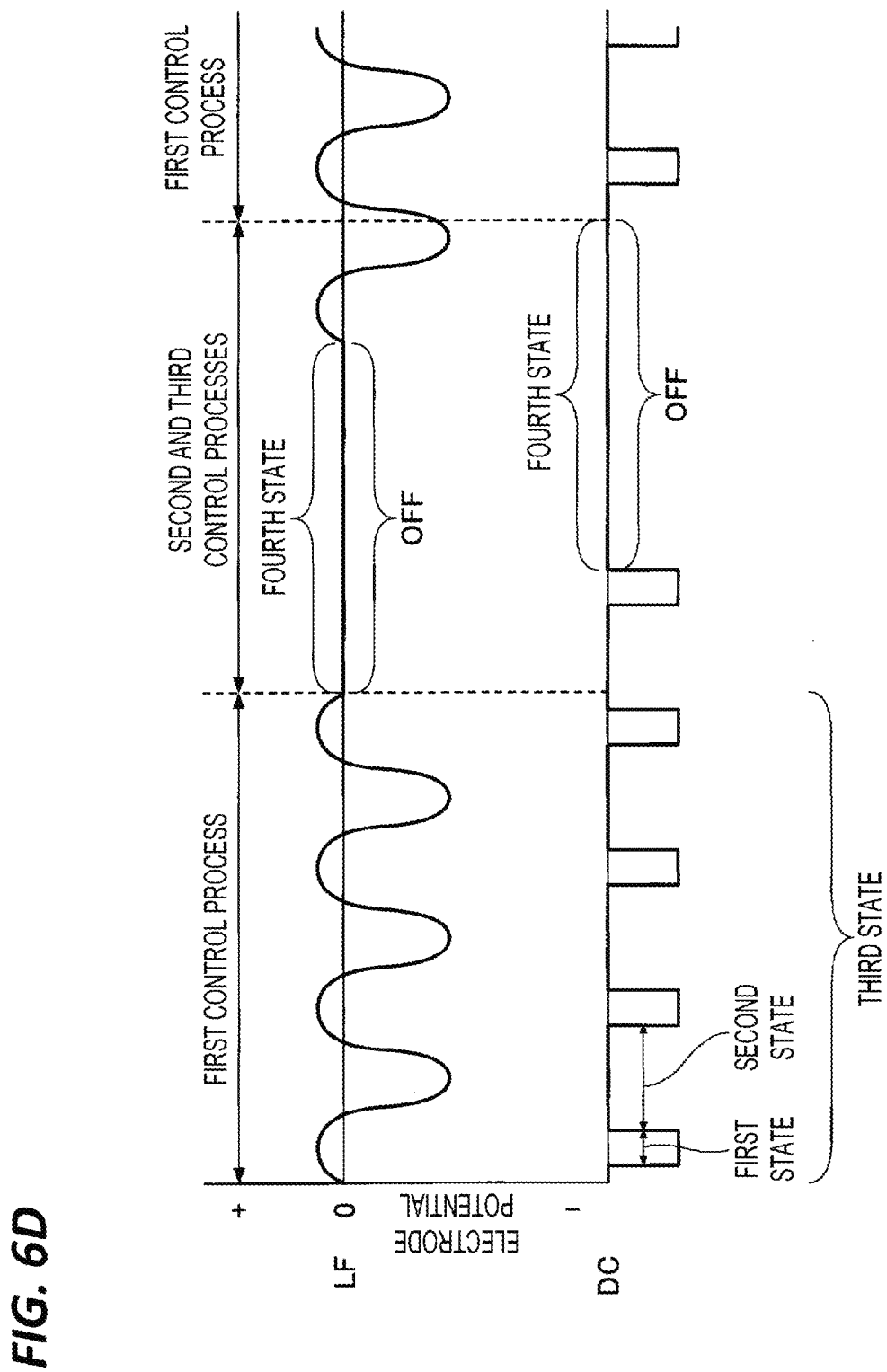

CONTROL METHOD AND PLASMA PROCESSING APPARATUS

CROSS-REFERENCE TO RELATED APPLICATIONS

This application is a national phase of PCT application No. PCT/JP2019/028024, filed on 17 Jul. 2019, which claims priority from Japanese Patent Application Nos. 2018-142855 and 2019-108223, filed on 30 Jul. 2018 and 10 Jun. 2019, respectively, all of which are incorporated herein by reference.

TECHNICAL FIELD

The present disclosure relates to a control method and a plasma processing apparatus.

BACKGROUND

A process of manufacturing a semiconductor device includes forming a hole or groove by performing a plasma etching on an etching target film formed on a semiconductor wafer using a resist as a mask. When the plasma etching is performed using a parallel plate type plasma processing apparatus, it has been proposed to apply a DC voltage to an upper electrode in order to improve the effect of sputtering onto the wafer surface (see, e.g., Patent Documents 1 and 2).

However, in recent years, a demand has increased for forming a pattern having a high aspect ratio by the plasma etching.

PRIOR ART DOCUMENT

Patent Document

Patent Document 1: Japanese Patent Laid-Open Publication No. 2006-270019
Patent Document 2: Japanese Patent Laid-Open Publication No. 2006-270017

SUMMARY OF THE INVENTION

Problem to be Solved

Especially, when a hole having a high aspect ratio is etched, a phenomenon occurs in which the etching rate decreases during the etching. As for one of the causes for the decrease of the etching rate in the hole with the high aspect ratio, it is presumed that since it is difficult to sufficiently inject electrons of plasma toward the bottom of a hole as the etching is progressed, and the charging at the bottom of the hole is not canceled by the electrons, it is difficult to draw ions to the bottom of the hole.

With respect to this problem, one aspect of the present disclosure prevents the decrease in etching rate by controlling the ion energy.

Means to Solve the Problem

An aspect of the present disclosure provides a control method of a plasma processing apparatus including a first electrode that places a workpiece thereon and a second electrode that faces the first electrode. The control method includes supplying a bias power to the first electrode, and supplying a negative DC voltage to the second electrode. The negative DC voltage periodically repeats a first state that takes a first voltage value and a second state that takes a second voltage value having an absolute value smaller than the first voltage value. The control method further includes a first control process of applying the first state of the negative DC voltage in a partial time period within each cycle of a signal synchronized with a cycle of a radio frequency of the bias power, or in a partial time period within each cycle of a periodically varying parameter measured in a transmission path of the bias power, and applying the second state continuously with the first state.

Effect of the Invention

According to an aspect of the present disclosure, it is possible to prevent the decrease in etching rate by controlling the ion energy.

BRIEF DESCRIPTION OF THE DRAWINGS

FIGS. 4A and 4B are views illustrating an example of an electrode potential and a plasma potential according to the embodiment.
FIGS. 5A and 5B are views illustrating an effect of the timing for supplying the DC according to the embodiment.
FIG. 6A is a timing chart illustrating a control method according to Modification 1-1 of the embodiment.
FIG. 6D is a timing chart illustrating a control method according to Modification 1-4 of the embodiment.

DETAILED DESCRIPTION TO EXECUTE THE INVENTION

Figure 1:
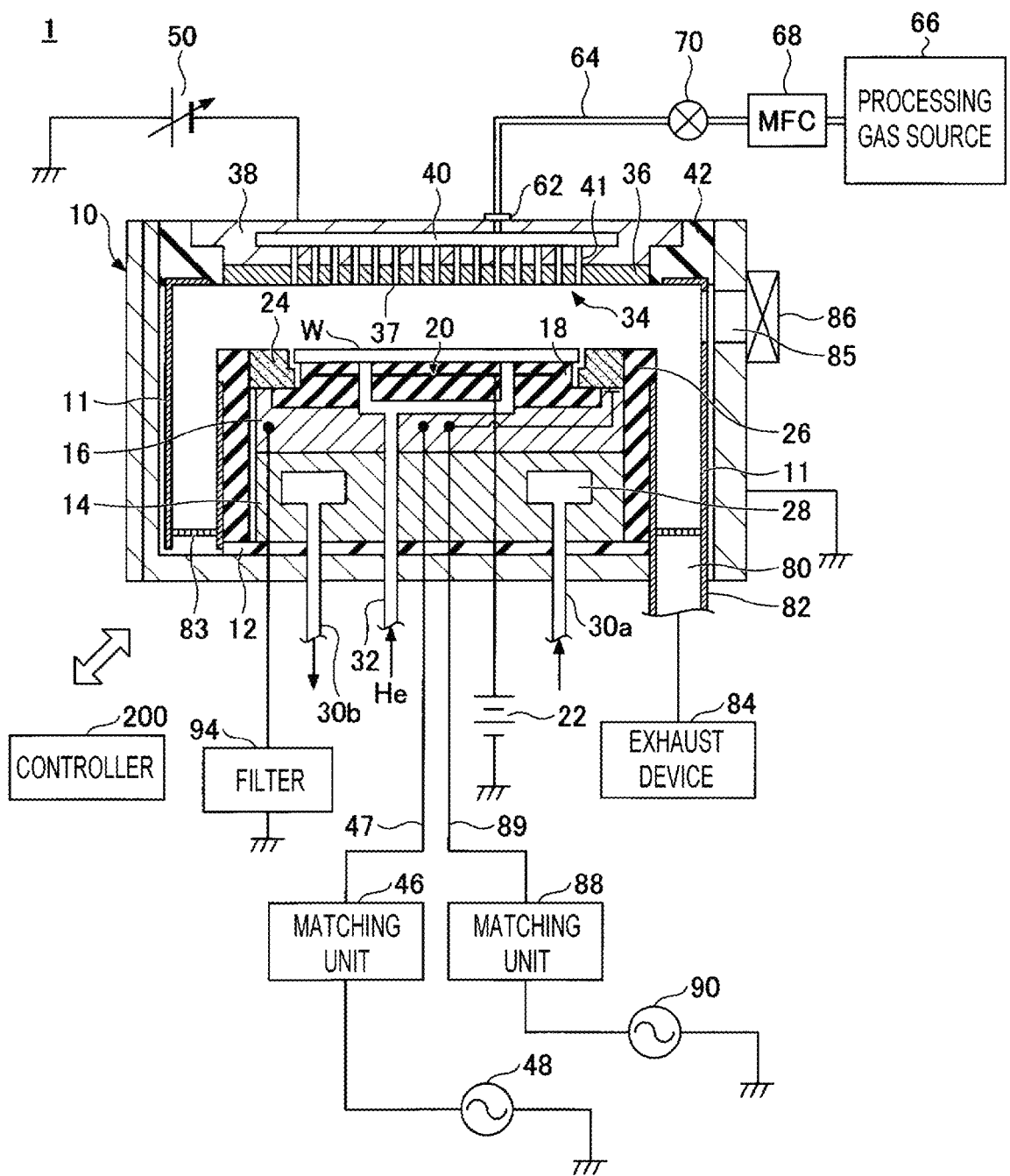
FIG. 1 is a view illustrating an example of a plasma processing apparatus according to an embodiment.

Hereinafter, embodiments for implementing the present disclosure will be described with reference to the drawings. In the descriptions and the drawings herein, components having a substantially similar configuration will be denoted by the same reference numerals, and overlapping descriptions thereof will be omitted.

Hereinafter, a radio frequency which is a source power may be referred to as HF, and the source power may be referred to as an HF power. A radio frequency which is a bias power having a frequency lower than the frequency of the source power may be referred to as LF, and the bias power may be referred to as an LF power.

Entire Configuration of Plasma Processing Apparatus

First, an example of a plasma processing apparatus 1 will be described with reference to FIG. 1. FIG. 1 is a view illustrating an example of a plasma processing apparatus according to an embodiment.

The plasma processing apparatus 1 according to the present embodiment is a capacitively coupled parallel plate plasma processing apparatus, and includes a cylindrical processing container 10 formed of, for example, aluminum with an anodized surface. The processing container 10 is grounded.

A columnar support 14 is disposed on the bottom of the processing container 10 via an insulating plate 12 made of ceramics or the like, and a stage 16 made of, for example, aluminum is provided on the support 14. The stage 16 makes up a lower electrode, and a wafer W which is an example of a workpiece is placed on the stage 16 via an electrostatic chuck 18.

The electrostatic chuck 18 is provided on the upper surface of the stage 16 to adsorb and hold the wafer W thereon by an electrostatic force. The electrostatic chuck 18 has a structure in which an electrode 20 made of a conductive film is sandwiched between a pair of insulating layers or insulating sheets. A DC power supply 22 is connected to the electrode 20. A DC voltage output from the DC power supply 22 is applied to the electrode 20. The wafer W is adsorbed and held on the electrostatic chuck 18 by the electrostatic force such as the Coulomb force generated by the application of the DC voltage.

A conductive edge ring 24 made of, for example, silicon is disposed at the periphery of the wafer W on the stage 12. The edge ring 24 may be referred to as a focus ring. A cylindrical inner wall member 26 made of, for example, quartz is provided on the lateral surfaces of the stage 16 and the support 14.

A coolant chamber 28 is provided, for example, in an annular shape inside the support 14. A coolant, for example, cooling water having a predetermined temperature is supplied in a circulative manner from a chiller unit provided outside to the coolant chamber 28 through pipes 30a and 30b, and the processing temperature of the wafer W on the stage 16 is controlled by the temperature of the coolant. The coolant is an example of a temperature adjustment medium that is supplied in a circulative manner to the pipes 30a and 30b, and the temperature adjustment medium may not only cool but also heat the stage 16 and the wafer W.

A heat transfer gas, for example, He gas is supplied between the upper surface of the electrostatic chuck 18 and the back surface of the wafer W from a heat transfer gas supply mechanism via a gas supply line 32.

An upper electrode 34 is provided above the stage 16 to face and be parallel with the stage 16. The space between the upper electrode 34 and the lower electrode serves as a plasma processing space. The upper electrode 34 forms a surface that faces the wafer W on the stage 16 and is in contact with the plasma processing space, that is, a facing surface.

The upper electrode 34 is supported on the upper portion of the processing container 10 via an insulating shielding member 42. The upper electrode 34 includes an electrode plate 36 that makes up the surface facing the stage 16 and is provided with a large number of gas injection holes 37, and an electrode support 38 that detachably supports the electrode plate 36 and is made of a conductive material, for example, aluminum with an anodized surface. The electrode plate 36 may be formed of, for example, silicon or SiC. A gas diffusion chamber 40 is provided inside the electrode support 38, and a large number of gas flow holes 41 extend downward from the gas diffusion chamber 40 to communicate with the gas injection holes 37.

A gas inlet port 62 is formed in the electrode support 38 to introduce a processing gas into the gas diffusion chamber 40, a gas supply pipe 64 is connected to the gas inlet port 62, and a processing gas source 66 is connected to the gas supply pipe 64. In the gas supply pipe 64, a mass flow controller (MFC) 68 and an opening/closing valve 70 are provided in this order from the upstream side. Then, a processing gas for an etching is supplied from the processing gas source 66. The processing gas reaches the gas diffusion chamber 40 from the gas supply pipe 64, and is injected in a shower form into the plasma processing space from the gas injection holes 37 through the gas flow holes 41. In this way, the upper electrode 34 functions as a shower head that supplies the processing gas.

A variable DC power supply 50 is connected to the upper electrode 34, and a DC voltage is applied from the variable DC power supply 50 to the upper electrode 34. A controller 200 controls the polarity and current/voltage of the variable DC power supply 50 and electronic switches for turning the current or voltage ON/OFF.

A first radio-frequency power supply 48 is connected to the stage 16 via a power feeding rod 47 and a matching unit 46. The first radio-frequency power supply 48 applies the LF power to the stage 16. As a result, ions are drawn into the wafer W on the stage 16. The first radio-frequency power supply 48 outputs a radio-frequency power having a frequency that falls within a range of 200 kHz to 13.56 MHz. The matching unit 46 matches the internal impedance of the first radio-frequency power supply 48 and a load impedance with each other.

A second radio-frequency power supply 90 is connected to the stage 16 via a power feeding rod 89 and a matching unit 88. The second radio-frequency power supply 90 applies the HF power to the stage 16. The frequency of HF is higher than the frequency of LF, and the second radio-frequency power supply 90 outputs an HF power having a frequency of 13.56 MHz or higher. For example, an LF power of 400 kHz and an HF power of 100 MHz may be output. The matching unit 88 matches the internal impedance of the second radio-frequency power supply 90 and a load impedance with each other. A filter 94 may be connected to the stage 16 to cause a predetermined radio frequency to pass through the ground. The HF power supplied from the second radio-frequency power supply 90 may be applied to the upper electrode 34.

An exhaust port 80 is provided in the bottom of the processing container 10, and an exhaust device 84 is connected to the exhaust port 80 via an exhaust pipe 82. The exhaust device 84 includes a vacuum pump such as a turbo molecular pump, and is able to reduce the pressure inside the processing container 10 to a desired degree of vacuum. A carry-in/out port 85 for the wafer W is provided in the side wall of the processing container 10, and is openable/closable by a gate valve 86. A deposit shield 11 is detachably provided along the inner wall of the processing container 10 to prevent etching by-products (deposits) from adhering to the processing container 10. That is, the deposit shield 11 makes up the wall of the processing container. The deposit shield 11 is also provided on the outer periphery of an inner wall member 26. An exhaust plate 83 is provided between the deposit shield 11 close to the wall of the processing container and the deposit shield 11 close to the inner wall member 26, at the bottom of the processing container 10. For the deposit shield 11 and the exhaust plate 83, an aluminum material coated with ceramics such as $Y_2O_3$ may be used.

When an etching is performed with the plasma processing apparatus 1 having the configuration described above, first, the gate valve 86 is brought into an open state, and the wafer W to be etched is carried into the processing container 10 through the carry-in/out port 85 and placed on the stage 16. Then, a processing gas for the etching is supplied from the processing gas source 66 to the gas diffusion chamber 40 at a predetermined flow rate, and supplied into the processing container 10 through the gas flow holes 41 and the gas injection holes 37. The inside of the processing container 10 is exhausted by the exhaust device 84, such that the pressure inside the processing container 10 becomes a set value within a range of, for example, 0.1 Pa to 150 Pa. Here, various gases that are used in related arts may be employed as the processing gas, and for example, a gas containing halogen elements such as $C_4F_8$ gas may be appropriately used. Other gases such as Ar gas and $O_2$ gas may be contained.

As described above, in a state where the etching gas is introduced into the processing container 10, the HF power is applied to the stage 16 from the second radio-frequency power supply 90. Further, the LF power is applied to the stage 16 from the first radio-frequency power supply 48. Further, the DC voltage from the variable DC power supply 50 is applied to the upper electrode 34. Further, the DC voltage from the DC power supply 22 is applied to the electrode 20, and the wafer W is held on the stage 16.

The processing gas injected from the gas injection holes 37 of the upper electrode 34 is dissociated and ionized mainly by the HF power, so that plasma is generated. The processing target surface of the wafer W is etched by radicals or ions in the plasma. By applying the LF power to the stage 16 so as to control the ions in the plasma, it is possible to broaden a plasma control margin such as enabling the etching of a hole with a high aspect ratio.

The plasma processing apparatus 1 is provided with the controller 200 that controls the entire operation of the apparatus. The controller 200 executes desired plasma processing such as an etching, according to a recipe stored in a memory such as a read only memory (ROM) or a random access memory (RAM). In the recipe, for example, process time, a pressure (exhaust of gas), a radio-frequency power or voltage, flow rates of various gases, the temperature inside the processing container (e.g., the temperature of the upper electrode, the temperature of the side wall of the processing container, the temperature of the wafer W, and the temperature of the electrostatic chuck), and the temperature of the coolant output from the chiller are set as control information of the apparatus for process conditions. The recipe that represents the programs or process conditions may be stored in a hard disk or a semiconductor memory. The recipe may be set at a predetermined position in a portable computer-readable storage medium such as a CD-ROM or a DVD in a state of being stored in the medium, and may be read out therefrom.

For example, the controller 200 may perform a control to apply a negative DC voltage output from the variable DC power supply 50 in a partial time period within each cycle of a signal synchronized with the cycle of the radio frequency of the bias power, or in a partial time period within each cycle of a voltage, current or electromagnetic field measured in a transmission path of the bias power, a light emission cycle of generated plasma, or a variation of sheath thickness of plasma above the wafer W (the lower electrode), and to alternately repeat ON/OFF of the negative DC voltage. Hereinafter, the variation of the voltage, current or electromagnetic field measured in the transmission path of the bias power, the light emission cycle of generated plasma, or the sheath thickness of plasma on the wafer (the lower electrode) may be referred to as a "periodically varying parameter." The controller 200 may perform a control to apply the HF voltage output from the second radio-frequency power supply 90 in a partial time period within each cycle of the signal synchronized with the cycle of the radio frequency of the bias power or in a partial time period within each cycle of the periodically varying parameter, and to alternately repeat ON/OFF of the HF voltage. As a result, the ion energy may be controlled, so that the decrease in etching rate may be prevented.

The transmission path of the bias power refers to the first radio-frequency power supply 48→the matching unit 46→the power feeding rod 47→the stage 16→plasma→the upper electrode 34→(ground). The voltage, current or electromagnetic field measured in the transmission path of the bias power refers to a voltage, current or electromagnetic field measured in the portion from the first radio-frequency power supply 48 to the stage 16 through the inside of the matching unit 46 and the power feeding rod 47, and in the upper electrode 34, or an electromagnetic field measured with plasma.

The negative DC voltage output from the variable DC power supply 50 periodically repeats a first state and a second state to be described later, and is controlled such that the first state is applied in a partial time period within each cycle of the signal synchronized with the cycle of the radio frequency of the bias power or in a partial time period of each cycle of the periodically varying parameter, and the second state is applied continuously with the first state.

When the negative DC voltage is applied in a partial time period within each cycle of the periodically varying parameter measured in the transmission path of the bias power, the periodically varying parameter may be any one of a voltage, current, and electromagnetic field measured in any one of the members from the stage 16 to the inside of the matching unit connected via the power feeding rod 47.

Figure 2A:
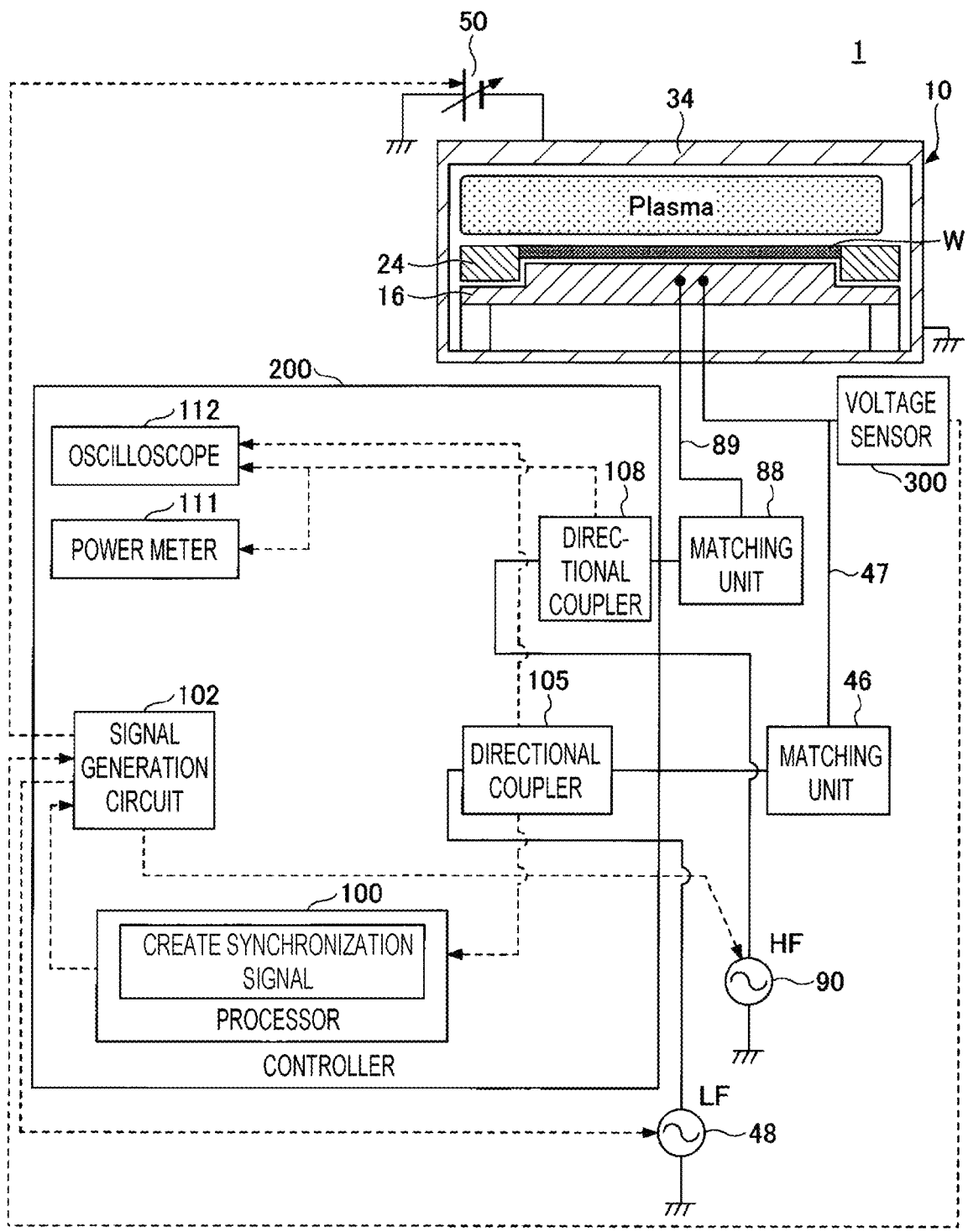
FIG. 2A is a view illustrating an example of a configuration of a controller according to the embodiment.

As the method of measuring the periodically varying parameter in the transmission path of the bias power, there is, for example, a method of installing a voltage sensor, a current sensor or a BZ sensor (a sensor for measuring an induced magnetic field) near any one portion of the transmission path of the bias power, and measuring a voltage, current or induced magnetic field of each portion. While FIG. 2A illustrates a voltage sensor 300, the sensor is not limited thereto and may be a current sensor or a BZ sensor. Each sensor described above may be connected to the power feeding rod 47, but the arrangement of each sensor is not limited thereto. A signal from the sensor such as the voltage sensor 300 is input to, for example, a signal generation circuit 102 of the controller 200.

Figure 2B:
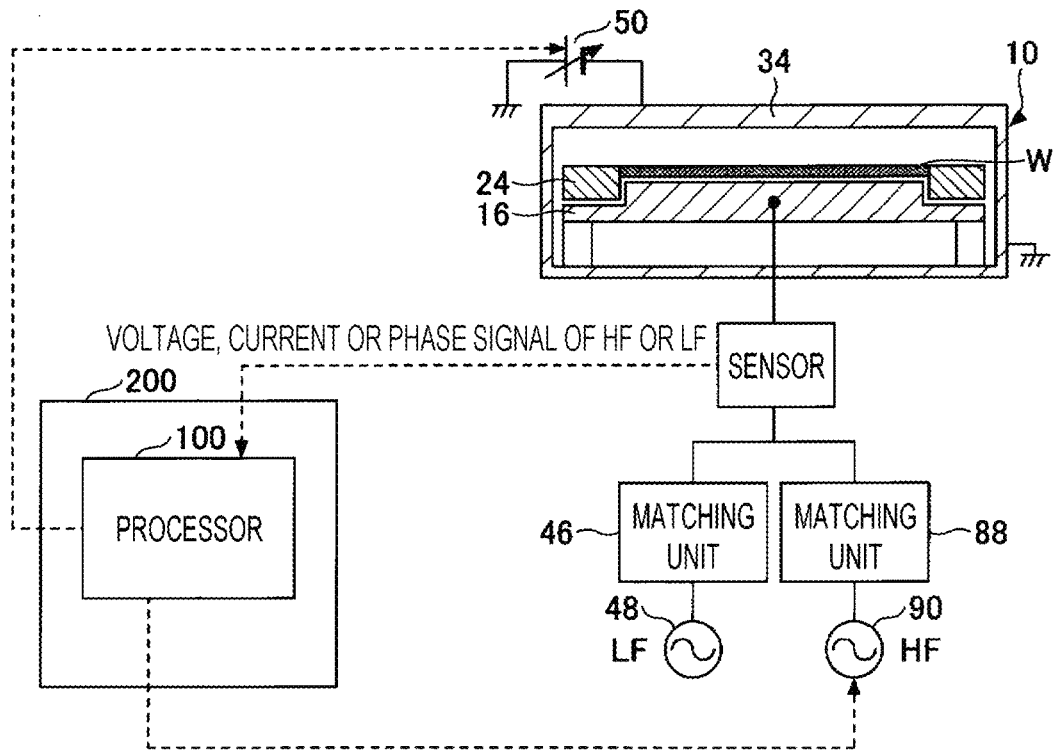
FIGS. 2B and 2C are views illustrating a case where a control is performed using a phase signal of a sensor attached to a power feeding system according to the embodiment, or a case where a control is performed using a signal synchronized with a cycle of a radio frequency of a bias power.

FIG. 2B illustrates an example of a case where the negative DC voltage is applied in a partial time period within each cycle of the periodically varying parameter measured in the transmission path of the bias power. In FIG. 2B, the processor 100 inputs any one of a voltage or current of HF, a voltage or current of LF, a phase signal of HF, and a phase signal of LF from a sensor such as a VI probe attached to the transmission path, as an example of the periodically varying parameter. The processor 100 applies the negative DC voltage output from the variable DC power supply 50 in a partial time period within each cycle of the periodically varying parameter.

Figure 2C:
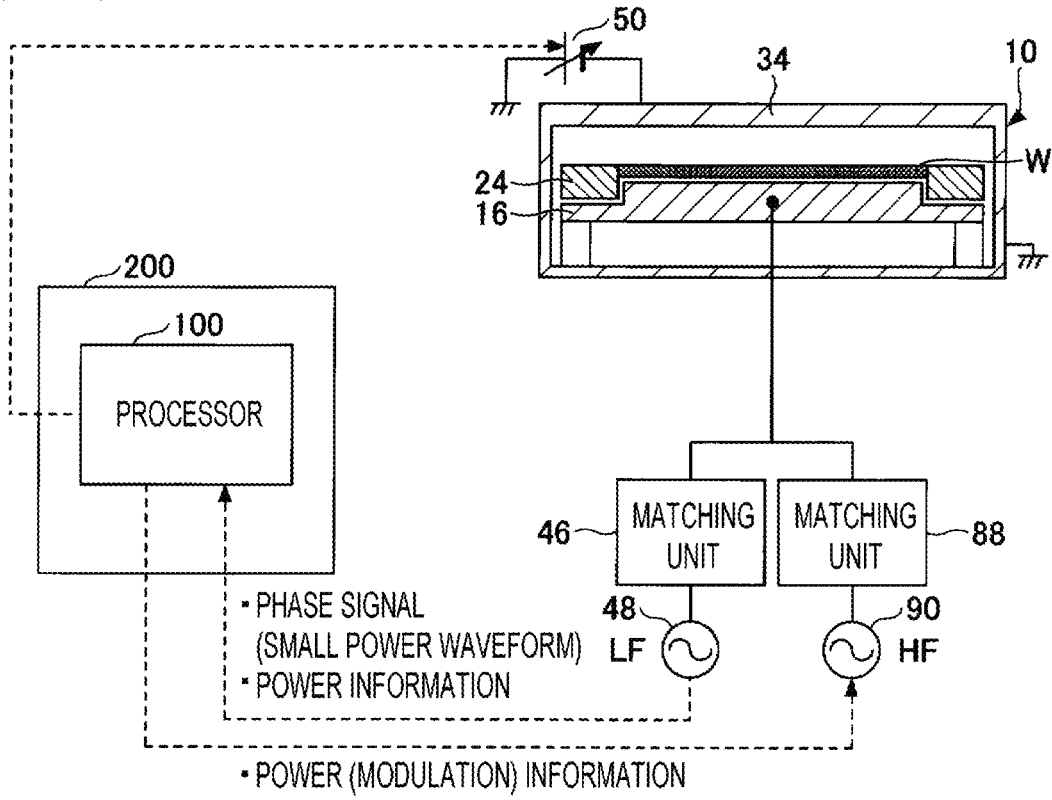

The processor 100 may generate the signal synchronized with the cycle of the radio frequency of the bias power output from the first radio-frequency power supply 48, without using the signal from the sensor. In this case, the process of measuring the state of the periodically varying parameter in the transmission path of the bias power may be omitted. For example, in FIG. 2C, the processor 100 inputs a phase signal of LF (small power waveform) or a signal on information of the bias power from the first radio-frequency power supply 48, and generates the signal synchronized with the cycle of the radio frequency of the bias power based on the input signal. The processor 100 outputs the generated signal to the variable DC power supply 50. The variable DC power supply 50 applies the negative DC voltage in a partial time period within each cycle of the signal. The generated signal includes modulation information of the source power, and the processor 100 may output the generated signal to the second radio-frequency power supply 90. The second radio-frequency power supply 90 applies the source power in a partial time period within each cycle of the signal.

Figure 3:
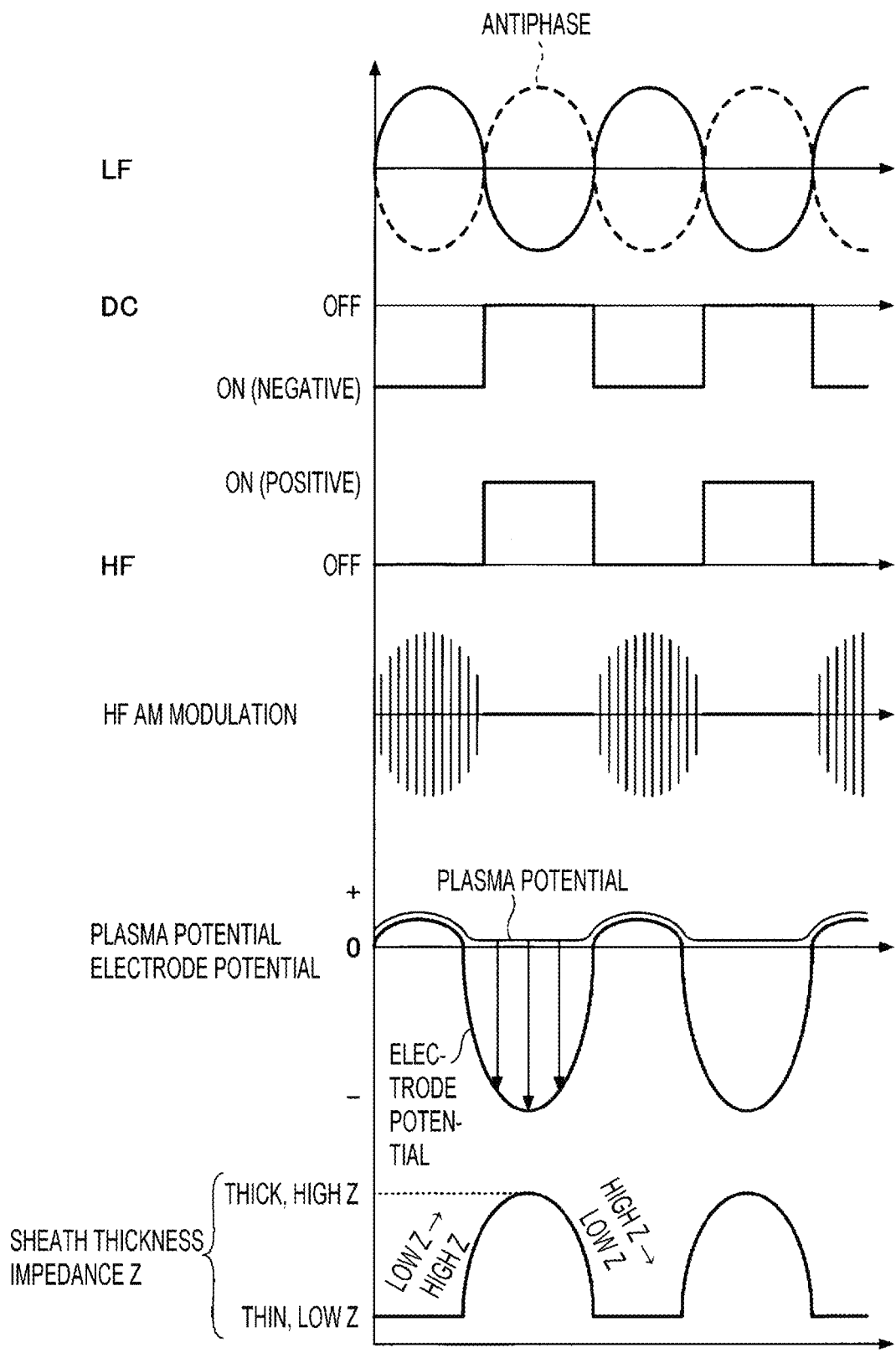
FIG. 3 is a view illustrating an example of a timing for supplying a DC or the like in accordance with an LF according to the embodiment.

The processor 100 may generate the signal synchronized with the cycle of the radio frequency of the bias power, without using the signal from the first radio-frequency power supply 48. In this case, the processor 100 generates, for example, a signal having the cycle represented in the LF of FIG. 3, and further, generates an ON/OFF signal synchronized with the generated signal as represented in the DC of FIG. 3. The processor 100 outputs the generated signal to the first radio-frequency power supply 48 and the variable DC power supply 50. The first radio-frequency power supply 48 outputs the bias power based on the signal. The variable DC power supply 50 applies the negative DC voltage in a partial time period within each cycle of the signal.

The processor 100 may generate the ON/OFF signal synchronized with the signal generated to have the cycle represented in the LF of FIG. 3, as represented in, for example, the HF of FIG. 3. The processor 100 outputs the generated signal to the second radio-frequency power supply 90. The second radio-frequency power supply 90 applies the source power in a partial time period within each cycle of the signal.

The light emission cycle of plasma and the cycle of the variation of sheath thickness of plasma above the wafer W may be used as indexes. The light emission cycle of plasma may be detected by, for example, a photodiode- or photo-micro-sensor. As for the sheath thickness, the variation of sheath thickness may be measured by using, for example, an ICCD camera and clicking the shutter of the camera at an interval of nanoseconds (e.g., 10 nsec to 250 nsec).

The stage 16 is an example of a first electrode that places the wafer W thereon. The upper electrode is an example of a second electrode that faces the first electrode. The first radio-frequency power supply 48 is an example of a bias power supply that supplies the LF power (the bias power) to the first electrode. The second radio-frequency power supply 90 is an example of a source power supply that supplies the HF power (the source power) having a frequency higher than that of the LF power, to the first or second electrode. The variable DC power supply 50 is an example of a DC power supply that supplies a DC voltage to the second electrode. The controller 200 is an example of a controller that controls the bias power supply, the source power supply, and the DC power supply. The potential of the lower electrode (the stage 16) to which the bias power is applied may be referred to as an electrode potential.

Configuration of Controller

The specific configuration of the controller 200 will be described with reference to FIG. 2A. The controller 200 includes a processor 100, a signal generation circuit 102, directional couplers 105 and 108, a power meter 111, and an oscilloscope 112. However, the power meter 111, the oscilloscope 112, and the directional coupler 108 may not be provided.

In the power feeding line of the first radio-frequency power supply 48, the directional coupler 105 is connected between the first radio-frequency power supply 48 and the matching unit 46. In the power feeding line of the second radio-frequency power supply 90, the directional coupler 108 is connected between the second radio-frequency power supply 90 and the matching unit 88.

The directional coupler 105 gives a portion of a traveling wave of LF to the oscilloscope 112. The directional coupler 108 gives a portion of a traveling wave of HF to the oscilloscope 112.

In an embodiment, the frequency of LF displayed on the oscilloscope 112 is, for example, 400 kHz, and the frequency of HF displayed on the oscilloscope 112 is, for example, 100 MHz. Accordingly, the waveform of the traveling wave of LF and the waveform of the traveling wave of HF may be observed in the oscilloscope 112.

The directional coupler 108 gives a portion of the traveling wave of HF to the power meter 111. The power meter 111 measures the electric energy of the traveling wave of HF.

The directional coupler 105 gives a portion of the traveling wave of LF to the processor 100. The processor 100 creates a DC synchronization signal to be synchronized with the traveling wave of LF. For example, the processor 100 may create the DC synchronization signal in synchronization with a positive timing of the traveling wave of LF. Instead of the directional coupler 105, the waveform of LF detected using a sensor such as a VI sensor or the like may be given to the processor 100.

The processor 100 gives the created synchronization signal to the signal generation circuit 102. The signal generation circuit 102 generates a control signal that is synchronized with the traveling wave of LF from the given synchronization signal, and gives the generated control signal to the variable DC power supply 50 and the first radio-frequency power supply 48.

There are two methods for generating the control signal as follows. In a case where the first radio-frequency power supply 48 is a general power supply, the directional coupler 105 takes out a portion of the voltage of LF output from the first radio-frequency power supply 48 as a waveform, and inputs the waveform to the processor 100. However, the present disclosure is not limited thereto, and the processor 100 may directly input a portion of the LF power or the like from the first radio-frequency power supply 48. The processor 100 creates an ON signal in synchronization with the signal of the input waveform or having an arbitrary delay and an arbitrary width from the signal of the input waveform, and transmits the created ON signal to the signal generation circuit 102.

The signal generation circuit 102 sends a command signal to the variable DC power supply 50 in order to generate the DC voltage during the ON signal. As the command signal, a control signal for generating the DC voltage during the ON signal or the ON signal itself is used according to the input form of the variable DC power supply 50. Similarly, the signal generation circuit 102 may send a command signal to the second radio-frequency power supply 90 in order to generate the HF power during the ON signal.

In a case where the first radio-frequency power supply 48 is an amplifier that amplifies the LF power, voltage or current, the signal generation circuit 102 may take out a portion of the LF power or the like output from the first radio-frequency power supply 48 as a waveform, without using a signal from the directional coupler 105, and create an ON signal having an arbitrary delay and an arbitrary width from the signal of the waveform. The signal generation circuit 102 transmits the signal of the waveform and the ON signal to the variable DC power supply 50. Similarly, the signal generation circuit 102 may transmit the signal of the waveform and the ON signal to the second radio-frequency power supply 90.

The method of generating the control signal described above is an example, and is not limited thereto. As long as the negative DC voltage may be applied in a partial time period within each cycle of the signal synchronized with the cycle of the radio frequency of the bias power or in a partial time period within each cycle of a given periodically varying parameter, and a control signal for controlling ON/OFF of the DC voltage to be alternately repeated may be generated, the present disclosure is not limited to the circuit of the controller 200 illustrated in FIGS. 2A to 2C, and other hardware or software components may be used.

The amplifier of the first radio-frequency power supply 48 amplifies the amplitude of a modulation signal (amplitude modulation (AM)) of the LF of 400 kHz, and supplies the LF to the lower electrode. The amplifier of the second radio-frequency power supply 90 amplifies the amplitude of a modulation signal of the HF of 100 MHz, and supplies the HF to the lower electrode.

From the given synchronization signal, the signal generation circuit 102 may generate a control signal for applying the negative DC voltage in a partial time period within each cycle of the periodically varying parameter measured in the transmission path of the bias power and controlling ON/OFF of the negative DC voltage to be alternately repeated, and may give the generated control signal to the variable DC power supply 50. The signal generation circuit 102 may generate a control signal for applying the negative DC voltage in a partial time period within each cycle of the signal synchronized with the cycle of the radio frequency of the bias power and controlling ON/OFF of the negative DC voltage to be alternately repeated, and may give the generated control signal to the variable DC power supply 50. The signal generation circuit 102 may generate a control signal for controlling High/Low of the negative DC voltage to be alternately repeated, instead of controlling ON/OFF of the negative DC voltage, and may give the generated signal to the variable DC power supply 50.

From the given synchronization signal, the signal generation circuit 102 may generate a control signal for applying the HF power in a partial time period within each cycle of the periodically varying parameter measured in the transmission path of the bias power and controlling ON/OFF of the HF power to be alternately repeated, and may give the generated control signal to the second radio-frequency power supply 90. The signal generation circuit 102 may generate a control signal for applying the HF power in a partial time period within each cycle of the signal synchronized with the cycle of the radio frequency of the bias power and controlling ON/OFF of the HF power to be alternately repeated, and may give the generated control signal to the second radio-frequency power supply 90. The signal generation circuit 102 may generate a control signal for controlling High/Low of the HF power to be alternately repeated, instead of controlling ON/OFF of the HF power, and may give the generated control signal to the second radio-frequency power supply 90.

FIG. 3 is a view illustrating an example of the DC and HF voltages applied according to LF. When LF is positive, the DC voltage is applied as a negative value, and the HF voltage is turned OFF. When LF is negative, the HF voltage is applied as a positive value, and the DC voltage is turned OFF. The electrode potential is determined by the LF voltage.

The processor 100 may create a synchronization signal for controlling the DC voltage and the HF power in a time period including a timing when the electrode potential is positive. However, the processor 100 is not limited thereto, and may create a synchronization signal for controlling the DC voltage and the HF power in a short time including a timing when the electrode potential becomes negatively deepest or at a timing when the electrode potential is negative.

Timing for Supplying DC Voltage

Next, effects of the timing for supplying the DC voltage in the present embodiment will be described with reference to FIGS. 4A to 5B. FIGS. 4A and 4B are views illustrating an example of the potentials of the upper and lower electrodes and the plasma potential according to the present embodiment. FIGS. 5A and 5B are views illustrating the timing for supplying the DC voltage and effects thereof according to the present embodiment.

Hereinafter, the potentials of the upper and lower electrodes, the plasma potential, and the behaviors of electrons and ions when mainly the LF voltage and the DC voltage are controlled will be described with reference to FIGS. 4A and 4B. Instead of the LF voltage, the LF current may be controlled. Instead of the DC voltage, the DC current may be controlled.

When the LF voltage is negative, the electrode potential (the potential of the wafer or the lower electrode) becomes negatively deeper than the electrode potential when the LF voltage is positive, due to a so-called self-bias voltage Vdc.

In each of FIGS. 4A and 4B, the left vertical axis represents the potential of the upper electrode 34, the right vertical axis represents the potential of the lower electrode (the stage 16), and the plasma potential in the plasma processing space is represented between the vertical axes. FIG. 4A illustrates the potential of each of the upper and lower electrodes and the plasma potential when the LF power and the HF power are supplied to the lower electrode. FIG. 4B illustrates the potential of each of the upper and lower electrodes and the plasma potential when the LF power and the HF power are supplied to the lower electrode, and furthermore, the negative DC voltage is supplied to the upper electrode 34.

The potential indicated by "A" in FIG. 4A is the plasma potential. The plasma potential becomes slightly higher than the highest potential in the processing container 10, as represented in the plasma potential and the electrode potential of FIG. 3. Accordingly, when the electrode potential is positive, the plasma potential becomes slightly larger than the LF voltage, and when the LF voltage is negative and when the potential of the wall of the processing container 10 is 0, the plasma potential becomes slightly larger than the potential (0) of the wall.

As illustrated in FIG. 4A, in a case where the LF power and the HF power are applied to the lower electrode, the plasma potential increases by the amplitude B of the HF voltage and the amplitude C of the LF voltage as much as B+C when the electrode potential is positive. Meanwhile, when the electrode potential is negative, the potential of the lower electrode becomes deep toward the negative potential due to the self-bias voltage Vdc.

In the case of FIG. 4A where the negative DC voltage is not applied to the upper electrode, the potential of the upper electrode is 0. At this time, electrons are accelerated by the sheath formed close to the upper electrode, that is, the slight potential difference between the potential 0 of the upper electrode and the plasma potential, and then, move at a constant velocity. Then, when the potential of the lower electrode is positive, the electrodes are incident on the wafer W while being decelerated according to the voltage of the sheath on the wafer W. Thus, when the potential of the lower electrode is positive, the difference between the plasma potential and the potential of the lower electrode is small, and thus, the energy of electrons that may be incident is also low. Accordingly, electrons having various energies are incident on the wafer W. Meanwhile, when the potential of the lower electrode is negative, electrons may not be incident on the wafer W. That is, when the lower electrode has the positive potential, electrons flow to the lower electrode, and when the lower electrode has the negative potential, ions flow to the lower electrode.

As illustrated in FIG. 4B, when the LF power and the HF power are applied to the lower electrode, and further, the negative DC voltage is applied to the upper electrode, the potential difference between the potential of the upper electrode and the plasma potential increases, as compared with a case where the negative DC voltage is not applied, so that the electrons are further accelerated by the potential difference. As a result, the electrons move from the plasma processing space to the lower electrode more linearly at a relatively high velocity. As a result, the possibility that the electrons may be incident on the wafer W increases, as compared with a case where the negative DC voltage is not applied.

However, the velocity of the electrons may become 0 or close to 0 when or before the electrons reach the wafer W, according to the potential of the lower electrode. In this case, the electrons adhere to the upper surface or the lateral surface of the hole, and do not reach the bottom of the hole. Then, the ions are also drawn to the upper surface or the lateral surface of the hole where the electrons exist, and thus, do not reach the bottom of the hole.

The electrons of which velocity becomes 0 before the electrons reach the wafer are accelerated in the opposite direction toward the plasma, due to the plasma potential. That is, in a case where the negative DC voltage is applied to the upper electrode 34, the range of the potential of the lower electrode in which the electrons accelerated by the sheath close to the upper electrode 34 may be incident on the wafer becomes the range of the potential E that has the same size as that of the negative DC voltage illustrated in FIG. 4B, and in the range of the potential F, the velocity of the electrons becomes 0, and the electrons may not reach the wafer. When the electrons do not reach the bottom of the hole, the bottom of the hole may not be negatively charged up. As a result, the positive charge-up at the bottom of the hole may not be canceled by ions.

Thus, as an example of the control method of the present embodiment, the negative DC voltage is applied to the upper electrode when the electrode potential is positive. As a result, the electrons are accelerated to the maximum, and since the sheath electric field on the wafer is low, the deceleration by the sheath may be minimized, so that the electrons may efficiently reach the bottom of the hole. As a result, ions may be drawn to the bottom of the hole, and the verticality of the etching may be improved, so that the decrease in etching rate may be prevented.

For example, it is assumed that a DC voltage of −1,000 V is applied to the upper electrode 34 as the negative DC voltage indicated by "D" in FIG. 4B. In this case, electrons are accelerated by the voltage of −1,000 V, and further accelerated by a plasma potential of about 10 V to 30 V. The accelerated electrons move at a constant velocity in the plasma of the plasma processing space while maintaining the straight traveling performance. Then, the electrons are decelerated at the sheath on the wafer W, and substantially vertically injected toward the bottom of the hole of the etching target film on the wafer. As a result, the bottom of the hole is negatively charged up. Then, ions having a larger mass than the electrons reach the bottom of the hole with a delay. As a result, the charging at the bottom of the hole is canceled.

FIG. 5A illustrates an example of a timing for supplying the DC voltage and behaviors of electrons and ions according to a comparative example. FIG. 5B illustrates an example of the timing for supplying the DC voltage and the behaviors of electrons and ions according to the present embodiment. In the comparative example of FIG. 5A, the DC voltage is continuously applied, regardless of whether the electrode potential is positive or negative. Meanwhile, in the present embodiment of FIG. 5B, the DC voltage is applied when the electrode potential is positive, and the application of the DC voltage is stopped when the electrode potential is negative.

According to the controls in FIGS. 5A and 5B, when the electrode potential is positive, the sheath on the wafer becomes thin as illustrated in the frames of the lower portions of FIGS. 5A and 5B. Accordingly, when the electrode potential is positive, electrons is less decelerated when passing through the thin sheath, and substantially vertically reach the wafer W to be incident on the wafer W. As a result, the electrons may reach the bottom of the hole as illustrated in the left holes of FIGS. 5A and 5B.

When the electrode potential is negative, the sheath formed on the wafer is thicker than that when the electrode potential is positive. Accordingly, in a case where the DC voltage is applied when the electrode potential is negative, the electrons may be decelerated when passing through the relatively thick sheath, or may not reach the wafer W or may adhere to the upper surface or the lateral surface of the hole even though the electrons reach the wafer W as illustrated in the right hole of the lower portion of FIG. 5A, and as a result, most of the electrons may not reach the bottom of the hole. The electrons adhering to the lateral surface of the hole draw ions, and may become one of the causes for the occurrence of a bowing.

Meanwhile, in a case where the application of the DC voltage is stopped when the electrode potential is negative, the electrons are further decelerated when passing through the relatively thick sheath, and the velocity of most of the electrons becomes 0 before the electrons reach the wafer W as illustrated in the right hole of the lower portion of FIG.

5B. As a result, the number of electrons adhering to the upper surface or the lateral surface of the hole may be reduced.

In another comparative example, the LF voltage and the HF voltage are turned ON/OFF at about 10 kHz to be applied in a pulse form, a DC voltage of about −1,000 V is applied at the OFF timing of the pulses of the LF voltage and the HF voltage, electrons that are subjected to an afterglow discharge are accelerated and injected toward the bottom of the hole, and ions are easily incident on the bottom of the hole later.

However, in this method, since the number of electrons left during the afterglow discharge after the application of the HF voltage is stopped is largely reduced, the number of electrons accelerated by the DC voltage of about −1,000 V is reduced, and as a result, the effect in injecting the electrons toward the bottom of the hole may not be sufficiently achieved.

In the present embodiment, the DC voltage is turned ON and applied to the upper electrode at a timing when the electrode potential is positive, and the acceleration of electrons is increased such that the electrons are injected into the hole without being decelerated as much as possible. As a result, the electrons may reach the bottom of the hole, and the ions that follow the electrons may be drawn to the bottom of the hole. Further, the application of the DC voltage to the upper electrode is stopped at a timing when the electrode potential is negative. As a result, the number of electrons adhering to the upper surface or lateral surface of the hole may be reduced, so that the occurrence of a bowing may be avoided, and the vertical etching shape may be achieved.

In this way, by controlling the timing for supplying the DC voltage according to whether the electrode potential is positive or negative, it is possible to control the ion energy in synchronization with the variation of sheath thickness. As a result, ions may be drawn to the bottom of the hole, and the decrease in etching rate may be prevented. Further, the vertical etching shape may be achieved.

As for an appropriate value of the frequency, in a case where the frequency of LF is low, when the LF voltage having the same power is introduced from the first radio-frequency power supply 48, the effect in increasing the ion energy is more significant than the effect in increasing the plasma density. As a result, ions may be drawn to the bottom of the hole, and the verticality of etching may be improved. Thus, in the control method according to the present embodiment, the frequency of LF may be 400 kHz or lower. As a result, ions may be more efficiently drawn to the bottom of the hole, so that the decrease in etching rate may be prevented, and the vertical etching shape may be achieved.

The DC voltage may be controlled to be a negative value (hereinafter, also referred to as ON) at the timing when the electrode potential is positive. However, the present disclosure is not limited thereto, and the DC voltage may be controlled to be turned ON during a time period including the timing when the electrode potential is positive, or at a timing when the electrode potential includes a positive peak. Instead of turning the DC voltage ON/OFF, the DC voltage may be controlled such that the absolute value thereof which is a negative value becomes High/Low. In this case, instead of turning the DC voltage ON, the DC voltage may be controlled such that the absolute value which is a negative value becomes High higher than Low, and instead of turning the DC voltage OFF, the DC voltage may be controlled such that the absolute value which is a negative value becomes Low. At this time, the DC voltage may be controlled to be High at the timing when the electrode potential is positive. However, the present disclosure is not limited thereto, and the DC voltage may be controlled to be High during a time period including the timing when the electrode potential is positive.

As for the DC voltage, not only a rectangular wave synchronized with the timing when the electrode potential is positive, but also a substantially rectangular wave including at least one of an ascending slow-up and a descending slow-down may be applied. The DC voltage may be applied at at least one of a timing shifted by a predetermined time after the timing when the electrode potential is positive, and a timing shifted by a predetermined time before the timing when the electrode potential is positive.

Especially, the positive-side waveform of the electrode potential may be distorted depending on the frequency of LF, gas species or the pressure. In this case, the DC voltage may be applied by selecting a timing shifted by a predetermined time from the timing when the electrode potential is positive such that the sheath is relatively thin, and the electrons easily enter.

The width of the time for applying the DC voltage may be adjusted to be longer or shorter by a predetermined time than the timing when the electrode potential is positive. With the control of the DC voltage, the HF power may be turned ON during a time period including the timing when the electrode potential is positive. At this time, the HF power may be turned ON at the timing when the electrode potential is positive, and the supply of the HF power may be turned OFF at the timing when the electrode potential is negative. Both of the DC voltage and the HF power may be applied in a partial time period within each cycle of the LF power, and both of the DC voltage and the HF power may be turned OFF in the remaining time period. Instead of turning the DC voltage and the HF power ON, the DC voltage and the HF power may be controlled to be High as a negative value, and instead of turning the DC voltage and the HF power OFF, the DC voltage and the HF power may be controlled to be Low as a negative value.

Control Method

As described above, the control method of the parallel plate type plasma processing apparatus 1 according to the present embodiment includes supplying the bias power to the lower electrode that places the wafer W thereon, and supplying the negative DC voltage to the upper electrode. In the control method, as illustrated in FIGS. 3 and 5B, the negative DC voltage has the first state that takes a first voltage value, and the second state that takes a second voltage value having an absolute value lower than the first voltage value, and the control method includes a first control process of applying the first state in a partial time period within each cycle of the signal synchronized with the cycle of the radio frequency of the bias power, or in a partial time period within each cycle of the periodically varying parameter measured in the transmission path of the bias power, and applying the second state continuously with the first state. The periodically varying parameter may be a voltage, a current, an electromagnetic field, a variation of light emission of generated plasma, or a variation of sheath thickness of plasma on the wafer.

As illustrated in FIG. 5B, a state where the DC voltage is turned ON (DC on; DC is negatively applied) is an example of the first state. A state where the DC voltage is turned OFF (DC off; DC is 0) is an example of the second state. In the first control process, the first state and the second state are repeated.

Instead of turning the DC voltage ON/OFF, the DC voltage may be controlled such that the absolute value thereof which is a negative value becomes High/Low. In this case, the state where the DC voltage is controlled such that the absolute value which is a negative value becomes High is an example of the first state. The state where the DC voltage is controlled such that the absolute value thereof which is a negative value becomes Low lower than High is an example of the second state. For example, the DC voltage of the second state may be 0, or the absolute value which is a negative value may be a value smaller than High.

Modifications 1-1 to 1-4

Next, a control method of a plasma processing apparatus 1 according to each of Modifications 1-1 to 1-4 of the embodiment will be described. In Modifications 1-1 to 1-4, a control is performed for intermittently stopping any one or both of the bias power and the DC voltage. FIGS. 6A to 6D are timing charts illustrating the control method according to Modifications 1-1 to 1-4 of the embodiment.

Modification 1-1 of FIG. 6A includes a second control process of intermittently stopping the DC voltage in an independent cycle from the cycle of the periodically varying parameter that is represented by the LF voltage as an example or the cycle of the signal synchronized with the cycle of the radio frequency of the bias power, in addition to the first control process. The first control process and the second control process are repeatedly performed.

In Modification 1-1, the LF voltage is applied in the same cycle in the first control process and the second control process. Meanwhile, the DC voltage alternately repeats the first state and the second state one or more times in the first control process, and is intermittently stopped in the second control process between first control processes.

In the first control process and the second control process, the frequency of LF may be, for example, 0.1 Hz to 100 kHz. The duty ratio of the DC voltage (=fourth state/(third state+fourth state)) may fall in a range of 1% to 99%.

The state where the DC voltage synchronized with the timing when the LF voltage is positive takes the first state in the first control process is an example of a third state. The state of the DC voltage that is independent from the cycle of the LF voltage in the second control process is an example of a fourth state which is different from the third state.

Figure 6B:
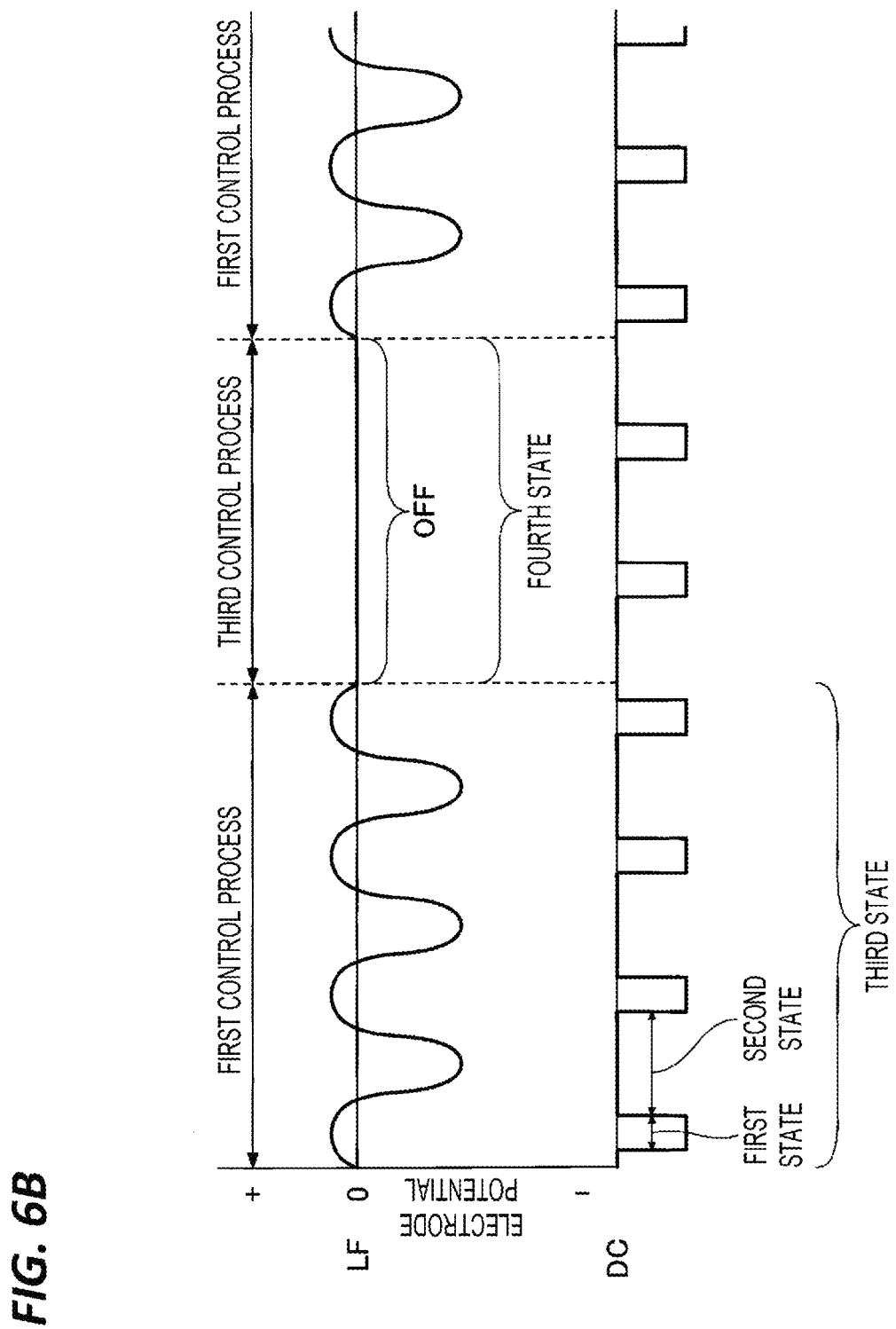
FIG. 6B is a timing chart illustrating a control method according to Modification 1-2 of the embodiment.

The control method according to Modification 1-2 of FIG. 6B includes a third control process of intermittently stopping the bias power (the LF voltage) in an independent cycle from the cycle of the DC voltage, in addition to the first control process which is the same as Modification 1-1. In the third control process, the state of the bias power is an example of the fourth state.

In Modification 1-2, the first control process and the third control process are repeatedly performed. In Modification 1-2, the DC voltage of the third control process repeats the first state and the second state in the same cycle as that in the first control process.

In the first control process, the frequency of LF may be, for example, 0.1 Hz to 100 Hz, and the duty ratio of the LF voltage (=fourth state/(third state+fourth state)) may fall in the range of 1% to 90%.

Figure 6C:
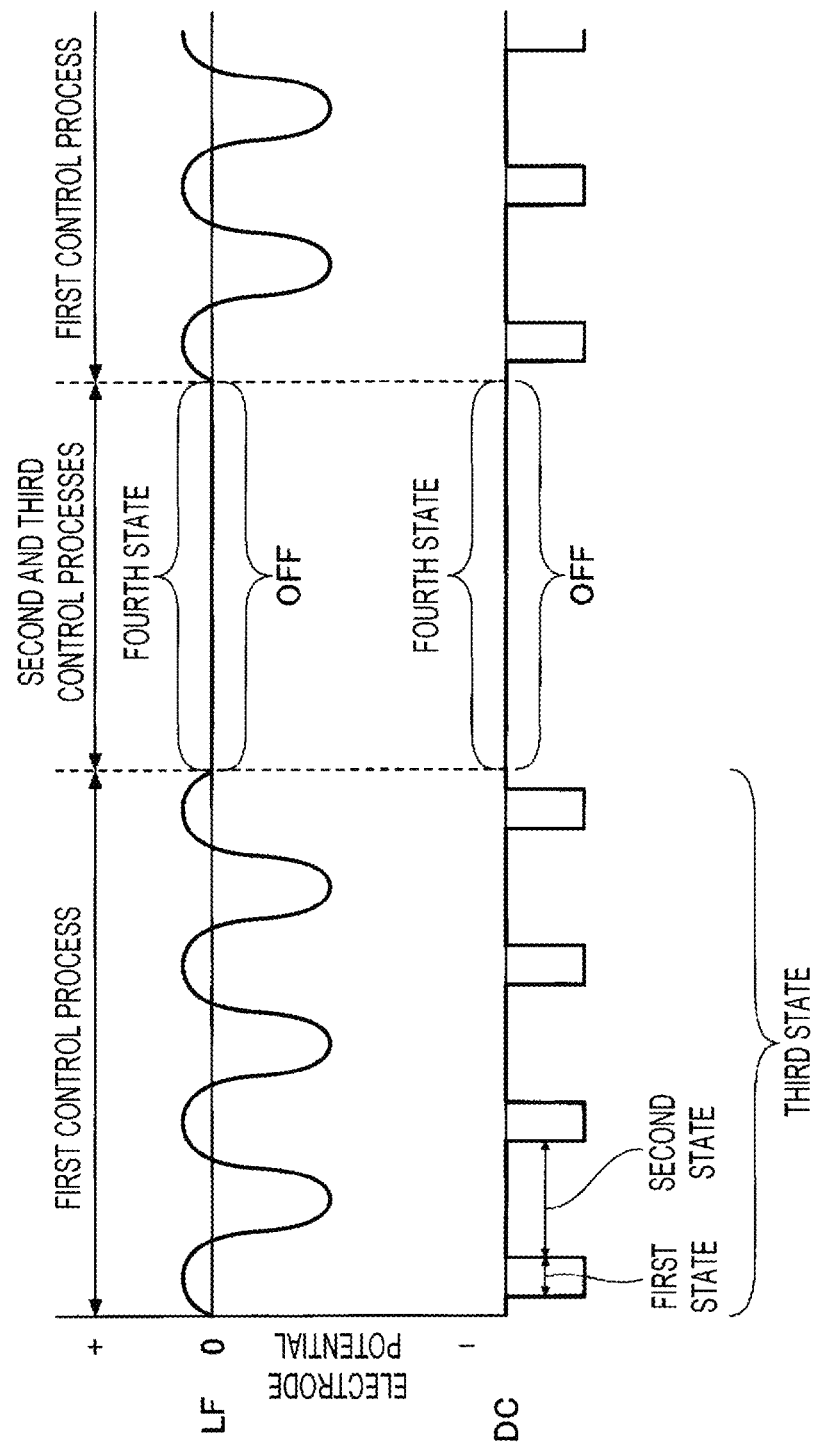
FIG. 6C is a timing chart illustrating a control method according to Modification 1-3 of the embodiment.

In the control method according to Modification 1-3 of FIG. 6C, the control of DC in the second control process of Modification 1-1 and the control of LF in the third control process of Modification 1-2 are performed, in addition to the first control process which is the same as Modification 1-1. That is, in Modification 1-3, the state where both of the DC voltage and the bias power are intermittently stopped is an example of the fourth state.

The cycle for intermittently stopping the bias power and the cycle for intermittently stopping the DC voltage may be synchronized with each other. In this case, the cycles for intermittently stopping the DC and the bias power may be the same as illustrated in FIG. 6C, or the DC may be shifted behind or in front of the bias power as illustrated in FIG. 6D.

In the third state of FIGS. 6A to 6D, the DC voltage is turned ON at the partial timing when the bias power is positive. However, the present disclosure is not limited thereto. Instead of periodically turning the DC voltage ON/OFF, the DC voltage may be controlled such that the absolute value thereof which is a negative value becomes High/Low.

Modification 2

Figure 7:
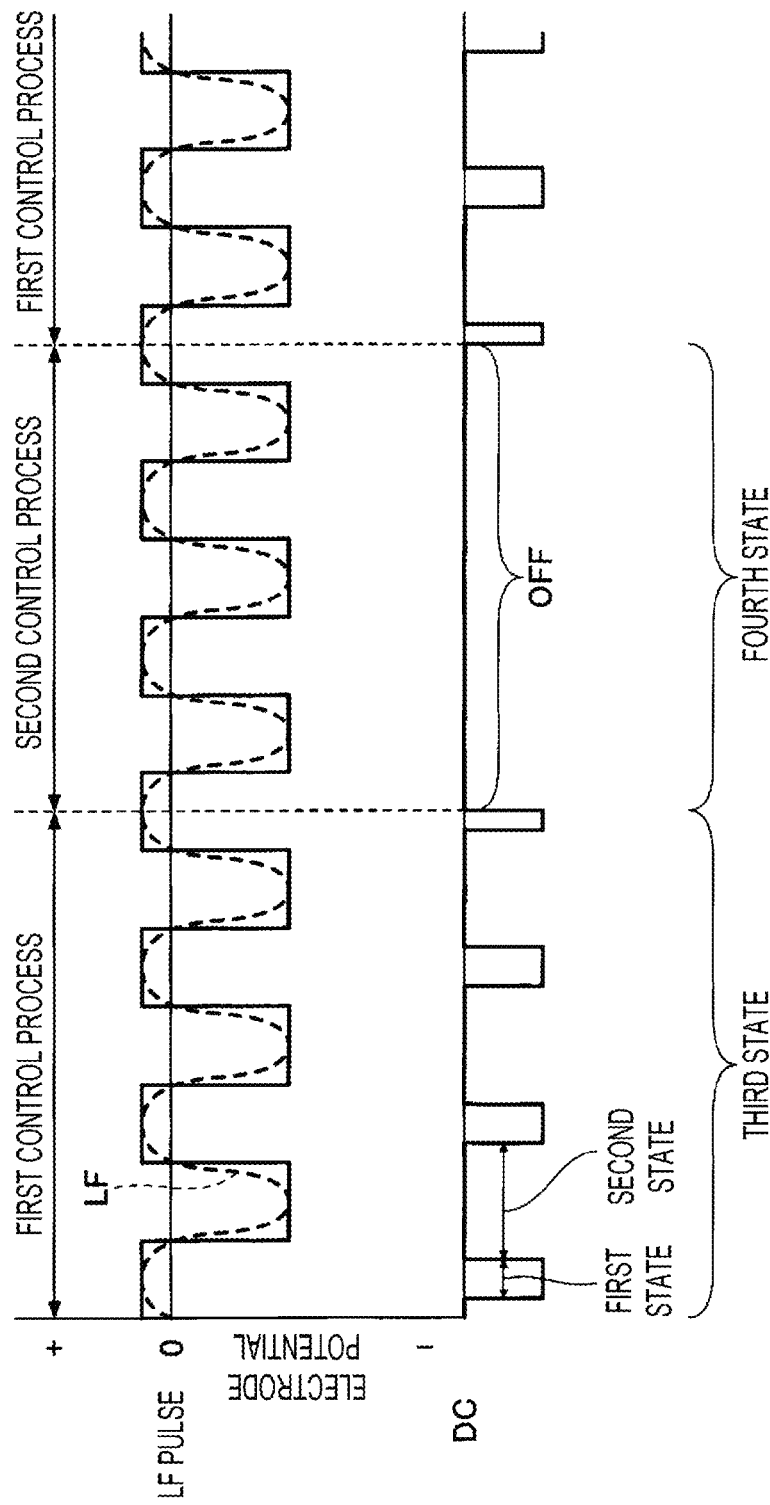
FIG. 7 is a timing chart illustrating a control method according to Modification 2 of the embodiment.

Next, a control method according to Modification 2 of the embodiment will be described with reference to FIG. 7. FIG. 7 is a timing chart illustrating the control method according to Modification 2 of the embodiment.

For example, in the control method according to Modification 2, a power in a pulse form that corresponds to the peak of the LF voltage (hereinafter, referred to as the "LF pulse") is applied to the stage 16 as illustrated in FIG. 7. The positive value of the LF pulse corresponds to the positive peak of the LF voltage, and the negative value of the LF pulse corresponds to the negative peak of the LF voltage.

In this case, in the control method according to Modification 2, the negative DC voltage periodically repeats the first state and the second state, the first state is applied in a partial time period within each cycle of the LF pulse, and the second state is applied continuously with the first state. With this control method as well, the ion energy may be controlled, so that the decrease in etching rate may be prevented.

Specifically, in a portion of or entire LF pulse that is positive, the DC voltage may be controlled to be negatively turned ON or such that the absolute value thereof which is a negative value becomes High, and in a portion of or entire LF pulse that is negative, the DC voltage may be controlled to be turned OFF or such that the absolute value thereof which is a negative value becomes Low. Then, since the LF pulse is binarized, and accordingly, the DC voltage is controlled to be binarized, the control is facilitated.

Modifications 3-1 and 3-2

Figure 8A:
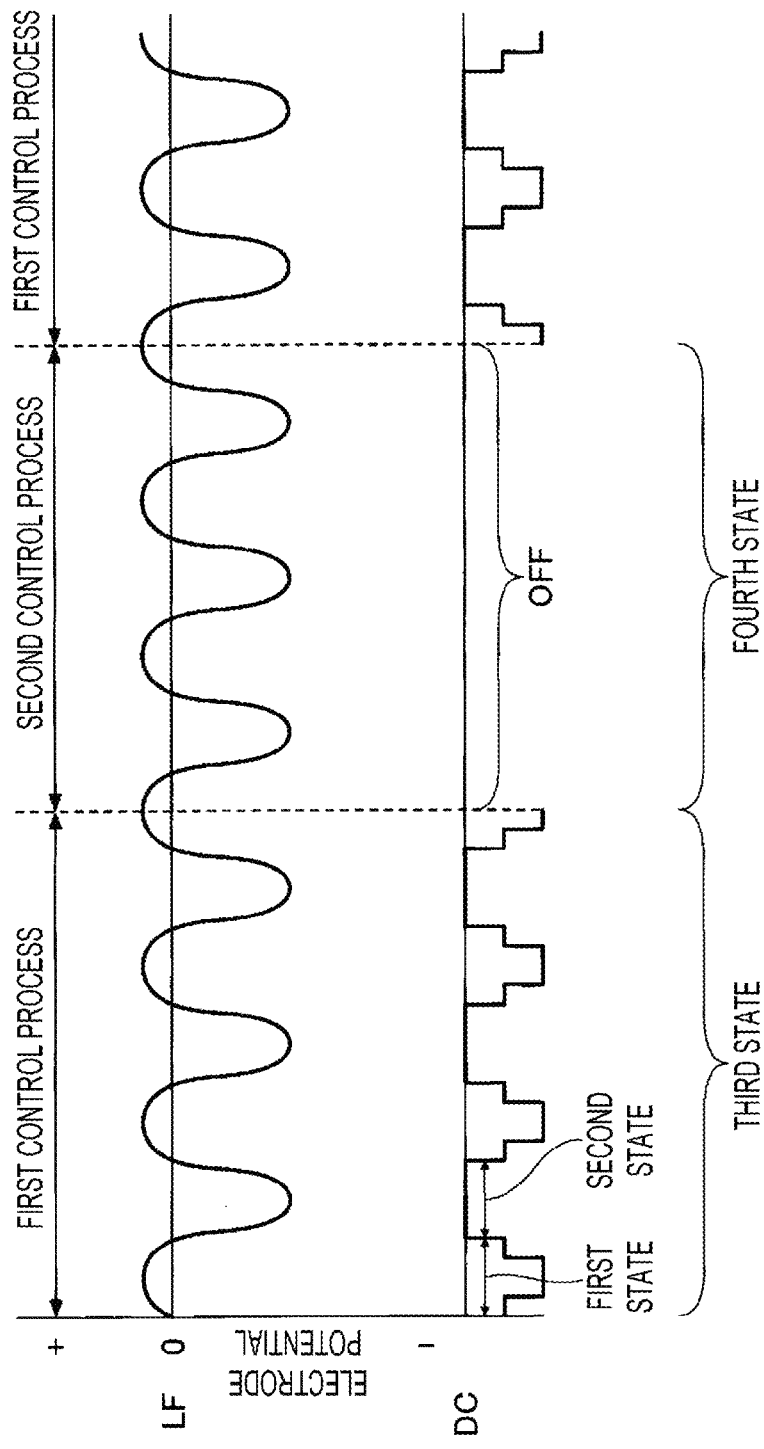
FIG. 8A is a timing chart illustrating a control method according to Modification 3-1 of the embodiment.
Figure 8B:
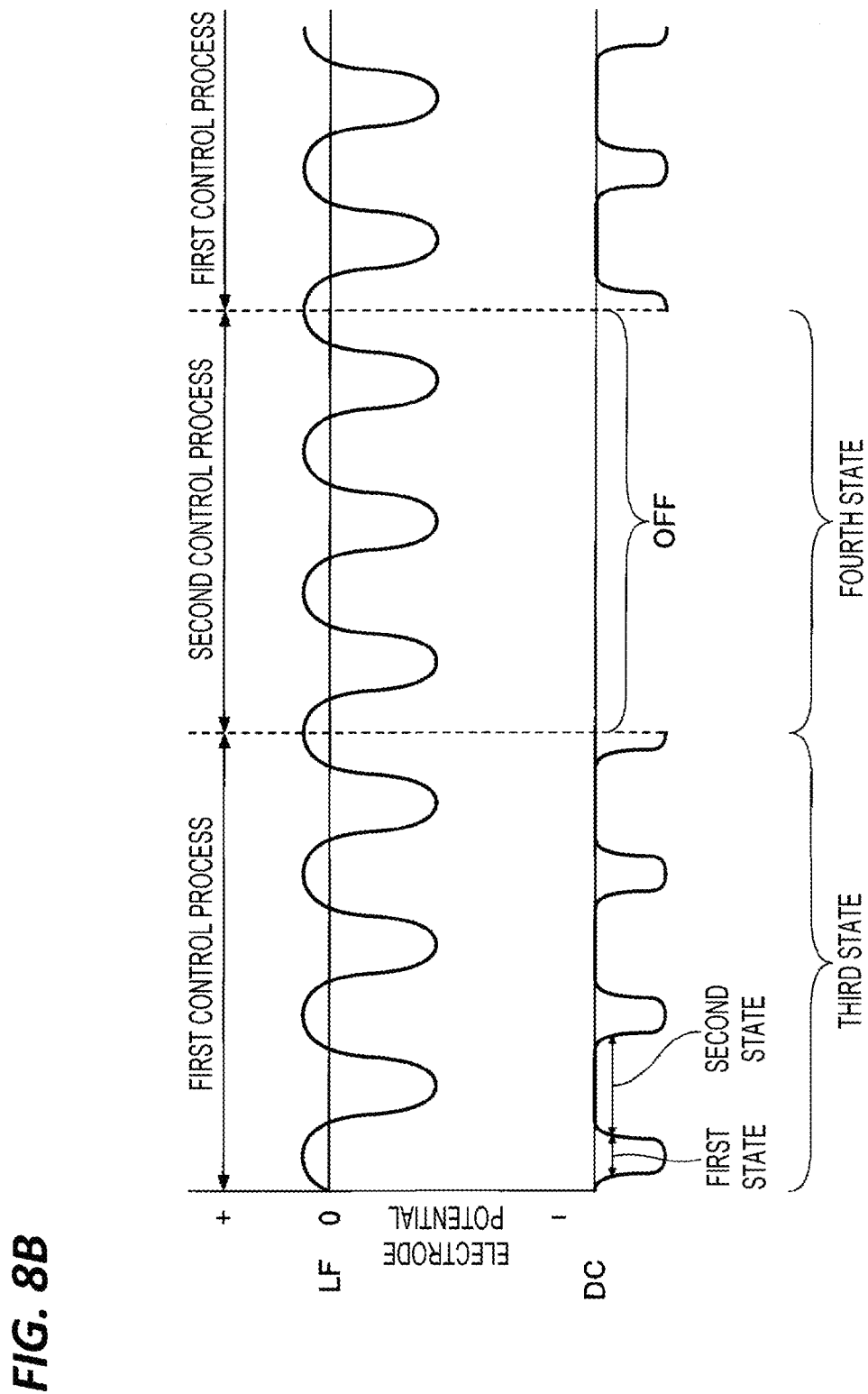
FIG. 8B is a timing chart illustrating a control method according to Modification 3-2 of the embodiment.

Next, control methods according to Modification 3-1 and 3-2 of the embodiment will be described with reference to FIGS. 8A and 8B. FIG. 8A is a timing chart illustrating the control method according to Modification 3-1 of the embodiment. FIG. 8B is a timing chart illustrating the control method according to Modification 3-2 of the embodiment.

For example, in the control methods according to Modifications 3-1 and 3-2, the first state of the DC voltage is applied in a partial time period when the periodically varying parameter which is the electrode potential as an example or the signal synchronized with the cycle of the radio frequency of the bias power includes a positive value, and the second state is applied continuously with the first state. In Modification 3-1, the first state of the DC voltage has two or more voltage values as negative values by stages.

In Modification 3-2, the first state of the DC voltage smoothly has two or more voltage values as negative values. However, the first state of the DC voltage may be applied in a partial time period when the electrode potential includes a negative value. In Modifications 3-1 and 3-2, the DC voltage in the first state is controlled with the plurality of values, so that the ion energy may be more accurately controlled, and the decrease in etching rate may be prevented.

Modification 4

Figure 9:
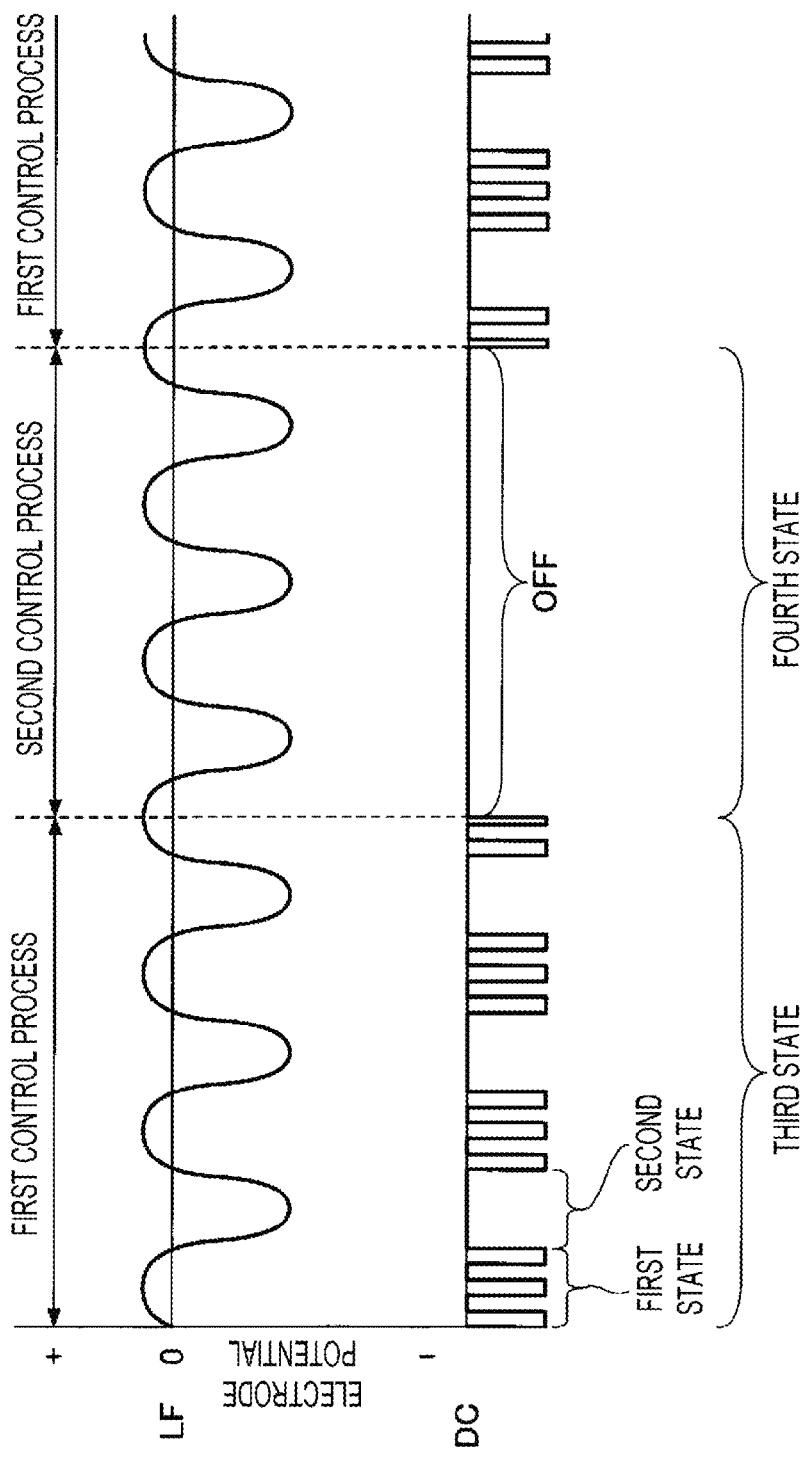
FIG. 9 is a timing chart illustrating a control method according to Modification 4 of the embodiment.

In Modification 4, the first state of the DC voltage takes a pulse type voltage value in which two or more voltage values are repeated. In the example of FIG. 9, the first state of the DC voltage repeats a negative voltage value and a zero voltage value. However, the present disclosure is not limited thereto, and two or more voltage values, for example, three voltage values may be repeated.

Modification 5

The bias power may be a power of a sine waveform, a pulse waveform, or a tailored waveform. That is, the bias voltage or current may be a sine waveform, an LF pulse waveform or the tailored waveform illustrated in FIG. 10. In the tailored waveform, the bias power may be modulated when the DC illustrated in FIG. 10 is in the second state or in the first state.

Figure 10:
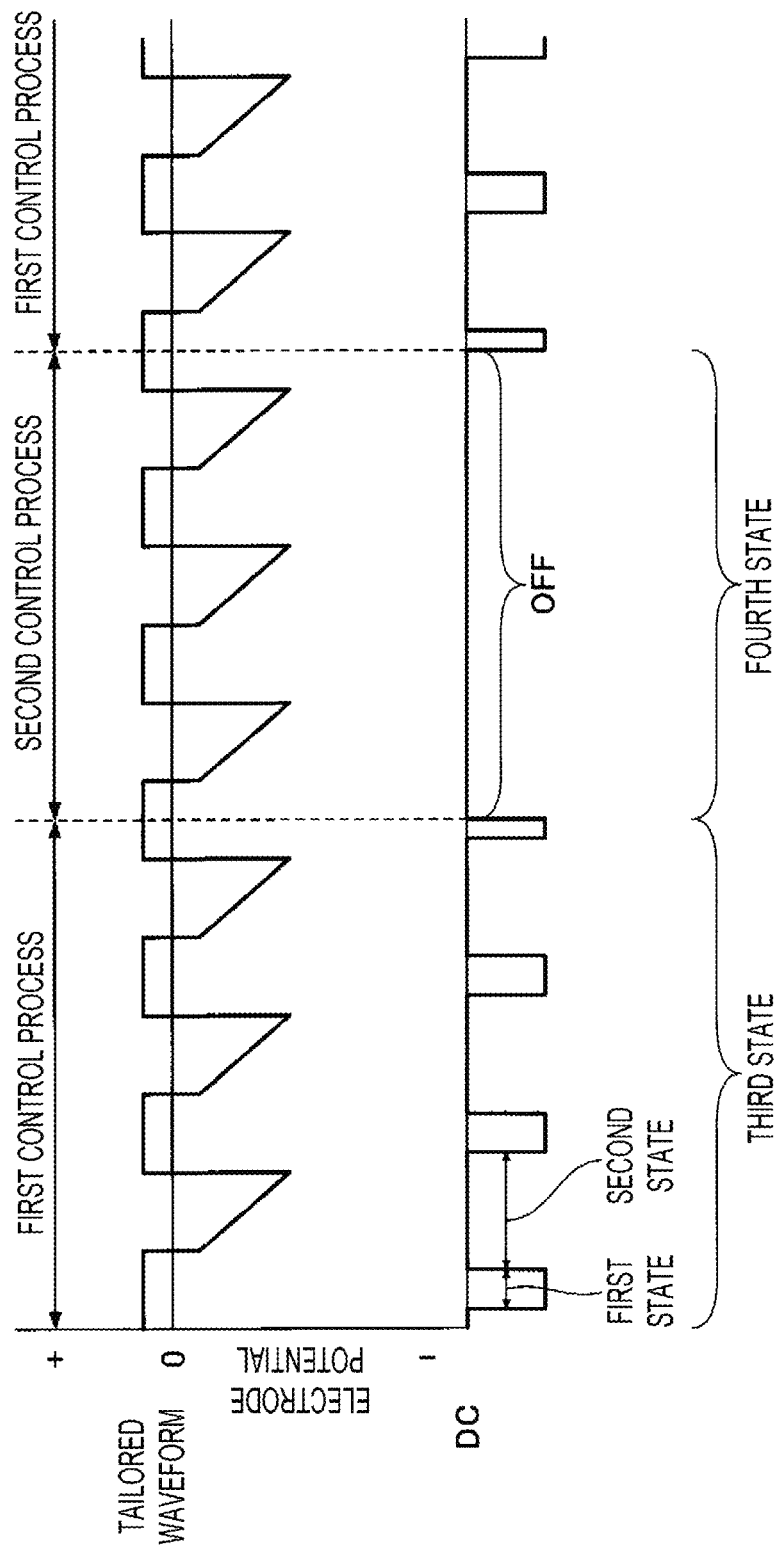
FIG. 10 is a timing chart illustrating a control method according to Modification 5 of the embodiment.

Similarly, when the first state of the DC takes two or more voltage values, the waveform of the DC may be the tailored waveform illustrated in FIG. 10, in addition to the waveforms illustrated in FIGS. 8A, 8B, and 9.

Miscellaneous

Below are appendices that set forth the controller 200.

Appendix 1

The controller 200 may supply the source power in the time period of the first state. That is, the source power has the first state and the second state that take difference voltage values, and the first state may be applied in a partial time period within each cycle of the signal synchronized with the cycle of the radio frequency of the bias power or in a partial time period within each cycle of the periodically varying parameter measured in the transmission path of the bias power, and the second state may be applied continuously with the first state.

Appendix 2

The controller 200 may supply at least one of the source power and the negative DC voltage at the timing when the electrode potential is positive.

While the embodiments of the control method and the plasma processing apparatus have been described, the control method and the plasma processing apparatus according to the present disclosure are not limited to the embodiments, and various modifications or improvements may be made within the scope of the present disclosure. The plurality of embodiments that have been described may be combined with each other within the scope that does not cause any inconsistency. Further, the embodiments and the plurality of modifications may be combined with each other within the scope that does not cause any inconsistency.

The plasma processing apparatus according to the present disclosure may also be applied to any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the descriptions herein, the wafer W has been described as an example of the workpiece. However, the substrate is not limited thereto, and may be any of various substrates used for liquid crystal display (LCD) and flat panel display (FPD), a CD substrate, a print substrate and others.

This application is based on and claims priorities from Japanese Patent Application No. 2018-142855 filed on Jul. 30, 2018 and Japanese Patent Application No. 2019-108223 filed on Jun. 10, 2019, and the disclosures of which are incorporated herein in their entireties by reference.

What is claimed is:

1. A plasma processing apparatus comprising:
    a first electrode configured to dispose a workpiece thereon;
    a second electrode configured to face the first electrode;
    a source power supply configured to supply a source power to either the first electrode or the second electrode;
    a bias power supply configured to supply a bias power having a frequency lower than a frequency of the source power to the first electrode;
    a DC power supply configured to supply a negative DC voltage to the second electrode; and
    a controller configured to control the source power supply, the bias power supply and the DC power supply,
    wherein the controller controls such that the negative DC voltage periodically repeats a first state that takes a first voltage value and a second state that takes a second voltage value having an absolute value smaller than the first voltage value, and
    the controller controls such that the first state of the negative DC voltage is applied to the second electrode in a partial time period within each cycle of a signal synchronized with a cycle of a radio frequency of the bias power between two adjacent negative peaks of the bias power, or in a partial time period within each cycle of a periodically varying parameter measured in a transmission path of the bias power, and the second state of the negative DC voltage is applied to the second electrode continuously with the first state of the negative DC voltage.

2. The plasma processing apparatus according to claim 1, wherein the controller creates a signal that is synchronized with the cycle of the radio frequency of the bias power or a synchronization signal that is synchronized with the periodically varying parameter, generates a DC power supply control signal for outputting the DC voltage from the synchronization signal, and transmits the generated control signal to the DC power supply.

3. The plasma processing apparatus according to claim 1, wherein the periodically varying parameter is a voltage, a current, an electromagnetic field, a variation of light emission of generated plasma, or a variation of sheath thickness of plasma on the workpiece.

4. The plasma processing apparatus according to claim 1, wherein the partial time period includes a timing when the signal synchronized with the cycle of the radio frequency of the bias power or the periodically varying parameter becomes a positive peak.

5. The plasma processing apparatus according to claim 1, wherein the controller intermittently stops the negative DC voltage in an independent cycle from the cycle of the signal synchronized with the cycle of the radio frequency of the bias power or the periodically varying parameter.

6. The plasma processing apparatus according to claim 1, wherein the controller intermittently stops the bias power in an independent cycle from the cycle of the negative DC voltage.

7. The plasma processing apparatus according to claim 1, wherein the controller intermittently stops the negative DC voltage in an independent cycle from the cycle of the signal synchronized with the cycle of the radio frequency of the bias power or the periodically varying parameter,
intermittently stops the bias power in an independent cycle from the cycle of the negative DC voltage, and
synchronizes the intermittently stopping of the negative DC voltage and the intermittently stopping of the bias power.

8. The plasma processing apparatus according to claim 1, wherein the bias power has a sine waveform, a pulse waveform or a tailored waveform.

9. The plasma processing apparatus according to claim 1, wherein the first state takes two or more voltage values.

10. The plasma processing apparatus according to claim 9, wherein the two or more voltage values of the first state have different levels.

11. The plasma processing apparatus according to claim 1, wherein a voltage value of the second state is 0.

12. A plasma processing apparatus comprising:
a first electrode configured to dispose a workpiece thereon;
a second electrode configured to face the first electrode;
a source power supply configured to supply a source power to either the first electrode or the second electrode;
a bias power supply configured to supply a bias power having a frequency lower than a frequency of the source power to the first electrode;
a DC power supply configured to supply a negative DC voltage to the second electrode; and
a controller configured to control the source power supply, the bias power supply and the DC power supply,
wherein the controller controls such that the negative DC voltage periodically repeats a first state that takes a first voltage value and a second state that takes a second voltage value having an absolute value smaller than the first voltage value,
wherein the controller controls such that the first state of the negative DC voltage is applied to the second electrode in a partial time period within each cycle of a signal synchronized with a cycle of a radio frequency of the bias power, or in a partial time period within each cycle of a periodically varying parameter measured in a transmission path of the bias power, and the second state of the negative DC voltage is applied to the second electrode continuously with the first state of the negative DC voltage, and
wherein the first state of the negative DC voltage overlaps with a positive peak of the bias power in the partial time period.

* * * * *